(12) United States Patent  (10) Patent No.: US 9,305,774 B2
Muraoka et al.  (45) Date of Patent: Apr. 5, 2016

(54) METHOD FOR PROCESSING THIN FILM AND METHOD FOR MANUFACTURING SEMICONDUCTOR DEVICE

(71) Applicant: SEMICONDUCTOR ENERGY LABORATORY CO., LTD., Atsugi-Shi, Kanagawa-Ken (JP)

(72) Inventors: Taiga Muraoka, Kanagawa (JP); Motomu Kurata, Kanagawa (JP); Shinya Sasagawa, Kanagawa (JP); Katsuaki Tochibayashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 78 days.

(21) Appl. No.: 14/219,111

(22) Filed: Mar. 19, 2014

(65) Prior Publication Data

US 2014/0287552 A1    Sep. 25, 2014

(30) Foreign Application Priority Data

Mar. 22, 2013 (JP) ................................ 2013-059315

(51) Int. Cl.
| | | |
|---|---|---|
| H01L 21/311 | (2006.01) | |
| H01L 21/02 | (2006.01) | |
| H01L 21/033 | (2006.01) | |
| H01L 21/3213 | (2006.01) | |
| H01L 29/786 | (2006.01) | |
| H01L 29/66 | (2006.01) | |

(52) U.S. Cl.
CPC ...... *H01L 21/02554* (2013.01); *H01L 21/0212* (2013.01); *H01L 21/02274* (2013.01);
(Continued)

(58) Field of Classification Search
CPC ............ H01L 21/3086; H01L 21/0212; H01L 21/0337; H01L 21/31138; H01L 21/32136; H01L 21/32139; H01L 27/1251
See application file for complete search history.

(56) References Cited

U.S. PATENT DOCUMENTS 5,681,773 A * 10/1997 Tseng ........................... 438/396
5,731,856 A     3/1998 Kim et al.
(Continued)

FOREIGN PATENT DOCUMENTS

EP      1737044 A    12/2006
EP      2226847 A     9/2010
(Continued)

OTHER PUBLICATIONS

Asakuma.n. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Bac Au
(74) *Attorney, Agent, or Firm* — Fish & Richardson P.C.

(57) ABSTRACT

A stable and minute processing method of a thin film is provided. Further, a miniaturized semiconductor device is provided. A method for processing a thin film includes the following steps: forming a film to be processed over a formation surface; forming an organic coating film over the film to be processed; forming a resist film over the organic coating film; exposing the resist film to light or an electron beam; removing part of the resist film by development to expose part of the organic coating film; depositing an organic material layer on the top surface and a side surface of the resist film by plasma treatment; etching part of the organic coating film using the resist film and the organic material layer as masks to expose part of the film to be processed; and etching part of the film to be processed using the resist film and the organic material layer as masks.

19 Claims, 16 Drawing Sheets

(52) U.S. Cl.
CPC .... *H01L21/02381* (2013.01); *H01L 21/02488* (2013.01); *H01L 21/02565* (2013.01); *H01L 21/02667* (2013.01); *H01L 21/0337* (2013.01); *H01L 21/31138* (2013.01); *H01L 21/32136* (2013.01); *H01L 21/32139* (2013.01); *H01L 29/66969* (2013.01); *H01L 29/7869* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,818,519 | B2 * | 11/2004 | Fang et al. .................... 438/301 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,695,632 | B2 * | 4/2010 | Lee ........................ C23F 4/00 216/41 |
| 7,732,819 | B2 | 6/2010 | Akimoto et al. |
| 7,875,419 | B2 | 1/2011 | Nagai et al. |
| 8,629,445 | B2 | 1/2014 | Tanaka et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0068836 | A1 * | 3/2010 | Yatagai et al. ................... 438/17 |
| 2010/0092800 | A1 | 4/2010 | Itagaki et al. |
| 2010/0109002 | A1 | 5/2010 | Itagaki et al. |
| 2013/0005147 | A1 * | 1/2013 | Angyal et al. ................. 438/692 |
| 2013/0140554 | A1 | 6/2013 | Yamazaki et al. |
| 2013/0161605 | A1 | 6/2013 | Sasagawa et al. |
| 2013/0161621 | A1 | 6/2013 | Isobe et al. |
| 2013/0187151 | A1 | 7/2013 | Yamazaki |
| 2013/0187161 | A1 | 7/2013 | Yamazaki |
| 2014/0103346 | A1 | 4/2014 | Yamazaki |
| 2014/0106504 | A1 | 4/2014 | Yamazaki et al. |
| 2014/0183529 | A1 | 7/2014 | Yamazaki et al. |
| 2014/0209898 | A1 | 7/2014 | Yamamoto et al. |
| 2014/0264323 | A1 | 9/2014 | Sasagawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05 Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08, Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure For Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies In ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5, InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid Stste Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Paper, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09 : Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

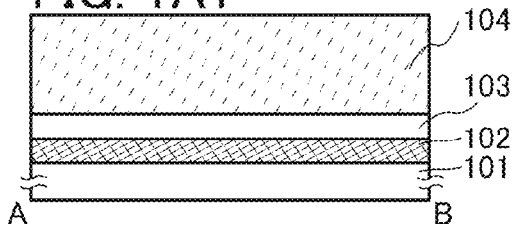
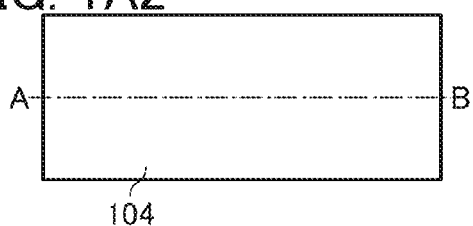
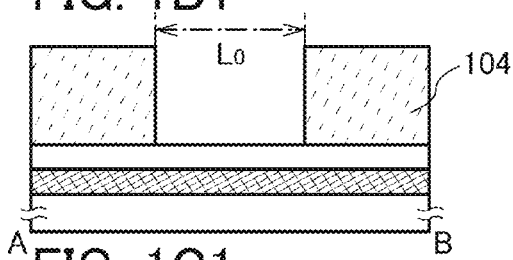
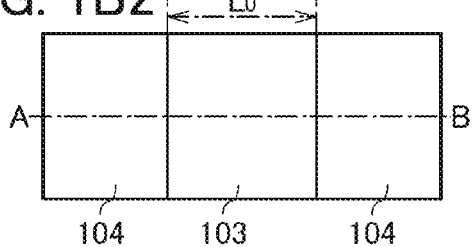
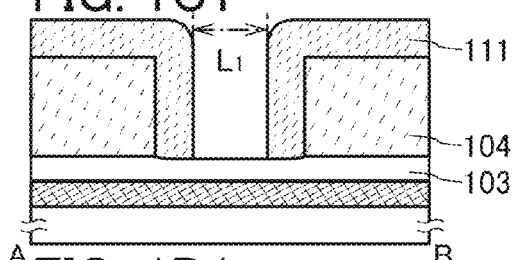
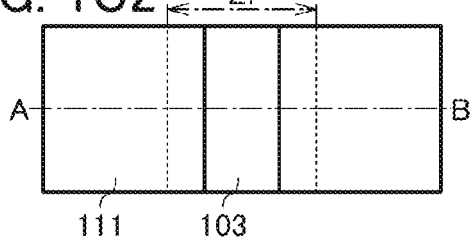
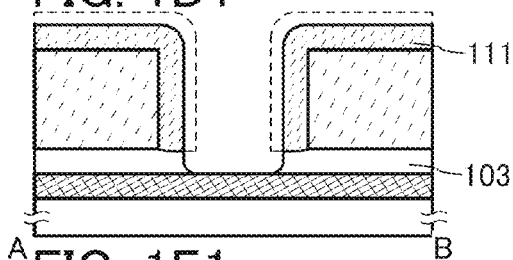
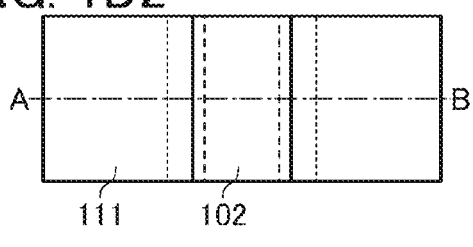
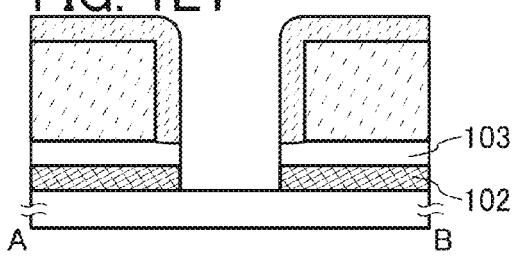
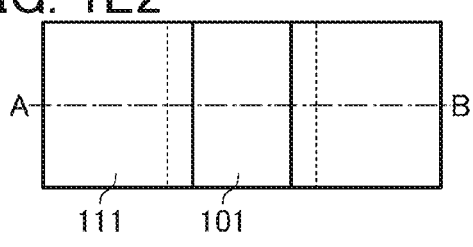
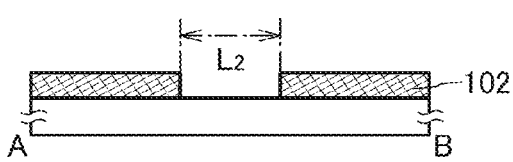
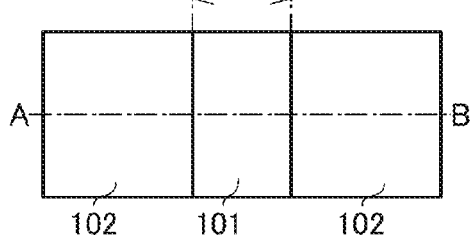

Sample 1  Right after patterning of resist film

Sample 1  Right after plasma treatment

Sample 1  Right after etching of conductive film

Sample 2  Right after patterning of resist film 40.6nm

Sample 2  Right after plasma reatment 18.0nm

Sample 2  Right after etching of conductive film 24.2nm

Comparative Example    Right after patterning of resist film 33.8nm

Comparative Example    Right after etching of conductive film 62.9nm

METHOD FOR PROCESSING THIN FILM AND METHOD FOR MANUFACTURING SEMICONDUCTOR DEVICE

BACKGROUND OF THE INVENTION

1. Field of the Invention

One embodiment of the present invention relates to a method for processing a thin film. One embodiment of the present invention relates to a semiconductor device and a method for manufacturing the semiconductor device.

In this specification and the like, a semiconductor device means all types of devices that can function by utilizing semiconductor characteristics, and a transistor, a semiconductor circuit, a memory device, an imaging device, an electro-optical device, a power generation device (e.g., a thin film solar cell and an organic thin film solar cell), an electronic device, and the like are all semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (also simply referred to as a display device). As semiconductor thin films applicable to the transistors, silicon-based semiconductor materials have been widely used, but oxide semiconductors have been attracting attention as alternative materials.

For example, a technique by which a transistor is formed using zinc oxide or an In—Ga—Zn-based oxide semiconductor as an oxide semiconductor is disclosed (see Patent Documents 1 and 2).

In recent years, demand for an integrated circuit in which semiconductor elements such as a miniaturized transistor are integrated with high density has risen with increased performance and reductions in the size and weight of an electronic device.

REFERENCE

Patent Document

[Patent Document 1] Japanese Published Patent Application No. 2007-123861
[Patent Document 2] Japanese Published Patent Application No. 2007-096055

SUMMARY OF THE INVENTION

One object of one embodiment of the present invention is to provide a stable and minute processing method of a thin film. One embodiment of the present invention relates to a miniaturized semiconductor device.

Another object of one embodiment of the present invention is to provide a highly reliable semiconductor device. Another object of one embodiment of the present invention is to obtain a semiconductor device including an oxide semiconductor, which has favorable electrical characteristics.

Note that the descriptions of these objects do not disturb the existence of other objects. In one embodiment of the present invention, there is no need to achieve all the objects. Other objects are apparent from and can be derived from the description of the specification, the drawings, the claims, and the like.

One embodiment of the present invention is a method for processing a thin film, including the following steps: forming a film to be processed (hereinafter, referred to as a processed film) over a formation surface; forming an organic coating film over the processed film; forming a resist film over the organic coating film; exposing the resist film to light or an electron beam; removing part of the resist film by development to expose part of the organic coating film; depositing an organic material layer on the top surface and a side surface of the resist film by plasma treatment; etching part of the organic coating film using the resist film and the organic material layer as masks to expose part of the processed film; and etching part of the processed film using the resist film and the organic material layer as masks.

Another embodiment of the present invention is a method for manufacturing a semiconductor device, including the following steps: forming a semiconductor film over an insulating surface; etching part of the semiconductor film to form an island-shaped semiconductor layer; forming a conductive film over the semiconductor layer; forming an organic coating film over the conductive film; forming a resist film over the organic coating film; exposing the resist film to light or an electron beam; removing part of the resist film by development to expose part of the organic coating film; depositing an organic material layer on the top surface and a side surface of the resist film by plasma treatment; etching part of the organic coating film using the resist film and the organic material layer as masks to expose part of the conductive film; etching part of the conductive film using the resist film and the organic material layer as masks to form a first electrode and a second electrode that are electrically connected to the semiconductor layer; forming a gate insulating layer over the semiconductor layer, the first electrode, and the second electrode; and forming a gate electrode that is positioned over the gate insulating layer and overlaps with the semiconductor layer.

In the method for manufacturing a semiconductor device, the exposure is preferably performed using an electron beam, extreme ultraviolet light, or X-rays.

In the method for manufacturing a semiconductor device, the plasma treatment is preferably performed using a gas including a compound containing fluorine and carbon as a reaction gas supplied to a treatment chamber of an apparatus, and the etching of the organic coating film is preferably performed by dry etching using a mixed gas of a gas including a compound containing fluorine and carbon and a gas containing oxygen as a reaction gas.

In the method for manufacturing a semiconductor device, it is preferable that the semiconductor film include an oxide semiconductor, and the plasma treatment and the etching of the organic coating film be each performed using a gas that does not contain chlorine as a reaction gas.

According to one embodiment of the present invention, a stable and minute processing method of a thin film can be provided. Further, a miniaturized semiconductor device can be provided.

BRIEF DESCRIPTION OF THE DRAWINGS

FIGS. 1A1 to 1F2 illustrate a method for processing a thin film of an embodiment.

DETAILED DESCRIPTION OF THE INVENTION

Figure 2A:
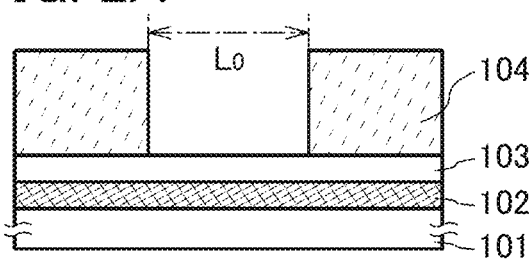
FIGS. 2A to 2C illustrate a method for processing a thin film of an embodiment.

Embodiments are described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, a method for processing a thin film of one embodiment of the present invention is described with reference to drawings.

[Example of Method]

FIGS. 1A1 to 1F2 are schematic cross-sectional views and schematic top views illustrating respective steps of a method for processing a thin film described in this embodiment. FIGS. 1A2, 1B2, 1C2, 1D2, 1E2, and 1F2 are schematic top views. FIGS. 1A1, 1B1, 1C1, 1D1, 1E1, and 1F1 are schematic cross-sectional views taken along line A-B in FIGS. 1A2, 1B2, 1C2, 1D2, 1E2, and 1F2, respectively.

<Formation of Processed Film>

First, a processed film 102 is formed over a substrate 101.

The substrate 101 is a base material for forming the processed film 102. For example, as the substrate 101, a glass substrate, a metal substrate, an alloy substrate, a semiconductor substrate, or the like can be used. The substrate 101 is not limited to a simple supporting substrate, and may be a substrate where a device such as a transistor is formed in advance.

The processed film 102 is processed by the method for processing a thin film of one embodiment of the present invention. The processed film 102 is not particularly limited as long as it is a thin film that can be etched by later etching. For example, as a material included in the processed film 102, a conductor of a metal or an alloy, a semiconductor, an insulator, or the like can be used. Alternatively, an oxide or a nitride of a metal or a semiconductor may be used.

The processed film 102 may have a single-layer structure of a film including any of the above materials, or a stacked-layer structure in which films including any of the above materials are stacked. In the case where the processed film 102 has a stacked-layer structure, as materials of the films included in the stacked-layer structure, materials that can be etched by one processing in a later etching step may be selected, or materials that can be etched sequentially under different conditions.

The method for forming the processed film 102 is not particularly limited, and can be selected as appropriate depending on the material(s) used for the processed film 102. For example, the processed film 102 can be formed by any of techniques for forming a thin film such as a sputtering method, a chemical vapor deposition (CVD) method, a molecular beam epitaxy (MBE) method, an atomic layer deposition (ALD) method, a pulsed laser deposition (PLD) method, an evaporation method, a plating method, a coating method, a droplet discharging method, a dipping method, a spray coating method, a spin coating method, a screen printing method, and an offset printing method.

In this embodiment, the processed film 102 is formed using a metal film by a sputtering method.

<Formation of Organic Coating Film and Resist Film>

Next, an organic coating film 103 and a resist film 104 are formed over the processed film 102 (FIGS. 1A1 and 1A2).

For the resist film 104, a photosensitive organic resin (also referred to as a photoresist) may be used. For example, a positive photoresist or a negative photoresist can be used. The resist film 104 can be formed to have a uniform thickness by a spin coating method or the like.

For the organic coating film 103, a non-photosensitive organic resin is used. Here, the organic coating film 103 may have a function of improving adhesion between the processed film 102 and the resist film 104. Further, the organic coating film 103 may have a light-blocking property and serve as an anti-reflective film suppressing the following phenomenon, for example: at the time of later exposure, light is transmitted through the resist film 104 and is then reflected at the surface of any of the processed film, the substrate 101, a stage supporting the substrate 101, and the like to transmit through the resist film 104 again. Examples of such an organic coating film serving as an anti-reflective film include bottom anti-reflection coating (BARC).

The organic coating film 103 can be formed by, for example, a spin coating method or the like. In the case where there is unevenness below the organic coating film 103, the organic coating film 103 preferably covers the unevenness. Forming the organic coating film 103 in this manner can suppress variation in thickness of the resist film 104 over the organic coating film 103, failure of exposure, and variation in width of the processed resist film 104.

<Exposure and Development of Resist Film>

Next, exposure is performed on the resist film 104. As light for the exposure, light with an i-line (wavelength: 365 nm), light with a g-line (wavelength: 436 nm), light with an h-line (wavelength: 405 nm), light in which the i-line, the g-line, and the h-line are mixed, or the like can be used, and the resist film 104 can be irradiated with any of the above light through a photomask. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

Then, development treatment is performed on the exposed resist film 104, so that an unnecessary portion of the resist film 104 is removed and part of a surface of the organic coating film 103 is exposed (FIGS. 1B1 and 1B2). Note that the development treatment includes bake treatment after development.

As illustrated in FIGS. 1B1 and 1B2, in this embodiment, the distance between two facing side surfaces of the developed resist film 104 is $L_0$.

<Formation of Organic Material Layer>

Next, plasma treatment is performed, so that an organic material layer 111 covering side surfaces and the top surface of the resist film 104 is formed (FIGS. 1C1 and 1C2).

The organic material layer 111 is a reaction product containing a component of a gas used for the plasma treatment. To form the organic material layer 111, it is preferable to use a gas including a compound containing fluorine and carbon, such as $CHF_3$, $C_4F_8$, $C_2F_6$, as a reaction gas used for the plasma treatment.

When plasma treatment is performed using a gas including a compound containing fluorine and carbon (also referred to as an organic fluorine compound), the gas including a compound containing fluorine and carbon is dissociated in a plasma, so that $CF$, $CF_2$, $CF_3$, and the like are generated. These are deposited on the surface of the resist film 104 as a reaction product; as a result, the organic material layer 111 including a polymer organic compound containing carbon and fluorine (also referred to as fluorocarbon polymer) can be formed on the surface of the resist film 104.

As a plasma source, a capacitively coupled plasma (CCP), an inductively coupled plasma (ICP), an electron cyclotron resonance (ECR) plasma, a helicon wave plasma (HWP), a microwave-excited surface wave plasma (SWP), or the like can be used. In particular, with ICP, ECR, HWP, and SWP, a high density plasma can be generated.

Depending on the conditions of the plasma treatment, as illustrated in FIG. 1C1, the part of the top surface of the organic coating film 103 is etched in some cases. At this time, a reaction product of the organic coating film 103 generated by etching enters the organic material layer 111 in some cases.

The organic material layer 111 formed on the side surface of the resist film 104 narrows the width of an exposed region of the organic coating film 103. More specifically, the width is narrowed by the thickness in the lateral direction of the organic material layer 111 deposited on the side surface of the resist film 104 (that is, the direction parallel to the formation surface).

The thickness in the lateral direction of the organic material layer 111 formed on the side surface of the resist film 104 can be controlled by the conditions of the plasma treatment. For example, the thickness or the density of the organic material layer 111 can be controlled by the concentration (flow rate) of the gas including a compound containing fluorine and carbon that is included in the reaction gas, the treatment time of the plasma treatment, the amount of power applied to a coil-shaped electrode, the amount of power applied to an electrode on the substrate side, and the like.

As the reaction gas used for plasma treatment, a gas including a compound containing fluorine and carbon is described here; however, the present invention is not limited to this, and a gas with which the organic material layer 111 is formed on the surface of the resist film 104 can be used. For example, a chlorine-based gas such as $CL_2$ or $BCl_3$ can be used. In the case where such a chlorine-based gas is used as the reaction gas, a main component of the organic material layer 111 formed on the side surface of the resist film 104 is a compound containing chlorine and carbon, which is a reaction product of a component of the etched organic coating film 103 (e.g., carbon) and a reaction gas. When part of the resist film 104 is etched by plasma treatment, the component of the resist film 104 enters the organic material layer 111 in some cases.

As illustrated in FIGS. 1C1 and 1C2, in this embodiment, the distance between two facing side surfaces of the organic material layer 111 formed on the side surfaces of the resist film 104 is $L_1$. The distance $L_1$ here is shorter than the distance $L_0$ in the stage before the formation of the organic material layer 111.

<Etching of Organic Coating Film>

Next, a region of the organic coating film 103 that is not covered with the resist film 104 or the organic material layer 111 is etched, so that part of the top surface of the processed film 102 is exposed (FIGS. 1D1 and 1D2).

The organic material layer 111 may be etched by either wet etching or dry etching. It is preferable that plasma treatment and etching be successively performed without exposure to the air by dry etching with an apparatus for performing the plasma treatment.

There is no particular limitation on a reaction gas used for the dry etching as long as the organic coating film 103 can be etched; however, a gas including a compound containing fluorine and carbon is preferably used. For example, in the case where a reaction gas including a compound gas containing fluorine and carbon is used for the plasma treatment, a mixed gas of a gas including a compound containing fluorine and carbon and a gas containing oxygen is used as a reaction gas used for the dry etching, so that the plasma treatment can be followed by dry etching in the apparatus with which the plasma treatment is performed.

Here, as illustrated in FIG. 1D1, the organic material layer 111 is also etched by the dry etching, which reduces the thickness of the organic material layer 111 in some cases. Thus, the distance between the two facing side surfaces of the organic material layer 111 formed on the side surfaces of the resist film 104 becomes longer than the distance $L_1$ before the etching.

In the case where a mixed gas of a gas including a compound containing fluorine and carbon and a gas containing oxygen is used as a reaction gas for the dry etching, fluorocarbon polymer is deposited and etched at the same time during the dry etching. The mixture ratio (gas flow rate) of the gas including a compound containing fluorine and carbon and the gas containing oxygen is adjusted in the reaction gas, whereby etching rate is higher than deposition rate, which enables etching of the organic coating film 103. Such selection of the reaction gas with which fluorocarbon polymer is deposited and etched at the same time on the side surface of the resist film 104 can suppress a reduction in thickness of the organic material layer 111 formed on the side surface of the resist film 104.

<Etching of Processed Film>

Next, part of the processed film 102 is etched using the resist film 104 and the organic material layer 111 as masks (FIGS. 1E1 and 1E2).

The processed film 102 may be etched by either wet etching or dry etching, and the etching method may be selected as appropriate depending on the material of the processed film 102.

Here, the processed film 102 is preferably etched by dry etching using a mixed gas of a gas including a compound containing fluorine and carbon and a gas containing oxygen as a reaction gas. For example, in the case where a conductive film is used as the processed film 102, the processed film 102 can be etched using such a reaction gas. By dry etching using such a reaction gas, the plasma treatment, the etching of the organic coating film 103, and the etching of the processed film 102 can be successively performed without exposure to the air.

Depending on the etching conditions of the processed film 102, the organic material layer 111 is also etched, and the distance between the facing side surfaces of the organic material layer 111 becomes longer in some cases. Thus, at the time of forming the organic material layer 111 by the plasma treatment, the organic material layer 111 is preferably formed thick in advance in consideration of the amount of etching of the organic material layer 111 at the time of etching of the processed film 102.

<Removal of Resist Film, Organic Coating Film, and Organic Material Layer>

Next, the resist film 104, the organic coating film 103, and the organic material layer 111 are removed (FIGS. 1F1 and 1F2).

As a method for removing the resist film 104, the organic coating film 103, and the organic material layer 111, for example, a removal method using a resist stripper can be given. Alternatively, they may be decomposed and removed by plasma treatment in an atmosphere containing oxygen.

With the above steps, the processed film 102 can be minutely processed. As illustrated in FIGS. 1F1 and 1F2, when the distance between two facing side surfaces of the processed film 102 after the processing is $L_2$, the distance $L_2$ is shorter than or equal to the distance $L_0$.

COMPARATIVE EXAMPLE

As Comparative example, a case where the organic material layer 111 is not formed is described.

First, in a similar manner to the above, the processed film 102, the organic coating film 103, and the resist film 104 are formed over the substrate 101. After that, exposure and development of the resist film 104 are performed, so that the resist film 104 is processed (FIG. 2A).

Figure 2B:
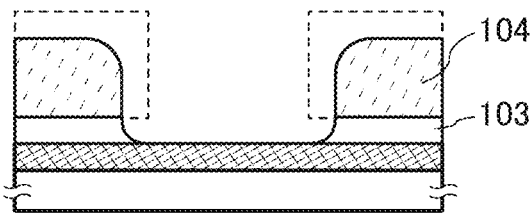

Then, the organic coating film 103 is etched (FIG. 2B). At this time, the resist film 104 is also etched, which increases the distance between the two facing side surfaces of the resist film 104.

Subsequently, the processed film 102 is etched using the resist film 104 as a mask. At this time, part of the resist film 104 is also etched in some cases.

Figure 2C:
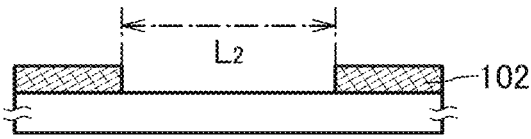

After that, the resist film 104 and the organic coating film 103 are removed (FIG. 2C).

As described above, in the case where the organic material layer 111 is not formed, part of the resist film 104 is etched at the time of the etching of the organic coating film 103 and the etching of the processed film 102. As a result, as illustrated in FIG. 2C, the distance $L_2$ between the facing side surfaces of the processed film 102 after processing is longer than the distance $L_0$ between the facing side surfaces of the resist film 104 after processing. The resist film 104 that is processed with a certain designed size is partly etching in such a manner, and as a result, the distance or width of the pattern of the processed film 102 after processing is deviated from (becomes longer than) the designed size. This phenomenon is often called critical dimension (CD) loss. The CD loss becomes more severe as the processed size becomes minuter.

The above is the description of Comparative example.

The method for processing a thin film of one embodiment of the present invention can suppress a reduction in resist width caused by the etching of the organic coating film 103 and the processed film 102 by forming the organic material layer 111 on the side surface of the resist film 104, so that CD loss can be substantially eliminated. Thus, processing for forming a thin film having a designed size can be stably performed even in the case of minute processing.

Further, as described above, since the thickness of the organic material layer 111 can be controlled easily, variation in the distance between the side surfaces of the processed film 102 after processing due to CD loss can be reduced.

Furthermore, even in the case where the resist film 104 is processed in the minimum feature size, the organic material layer 111 is formed to have a large thickness, so that the distance between the side surfaces of the processed film 102 after processing can be shorter than the minimum feature size. In other words, by the processing method of one embodiment of the present invention, a processed film can be processed to be smaller than the minimum feature size of the resist film.

For example, even in the case where the minimum feature size is approximately 20 nm to 30 nm because of various limitations such as a light-exposure apparatus, a light source, and a material of a resist film, the distance between the side surfaces of the processed film may be as small as 25 nm or smaller, 20 nm or smaller, 18 nm or smaller, 15 nm or smaller, or 12 nm or smaller.

Note that plasma treatment is performed for forming the organic material layer 111 before the etching of the organic coating film 103 in the above method; however, plasma treatment for forming the organic material layer 111 may be performed at any time between the etching of the organic coating film 103 and the etching of the processed film 102.

Note that this embodiment can be combined with any of the other embodiments and examples described in this specification as appropriate.

Embodiment 2

In this embodiment, a manufacturing method of a semiconductor device to which a method for processing a thin film of one embodiment of the present invention is applied is described with reference to drawings. A transistor is described below as an example of the semiconductor device.

Structural Example

Figure 3A:
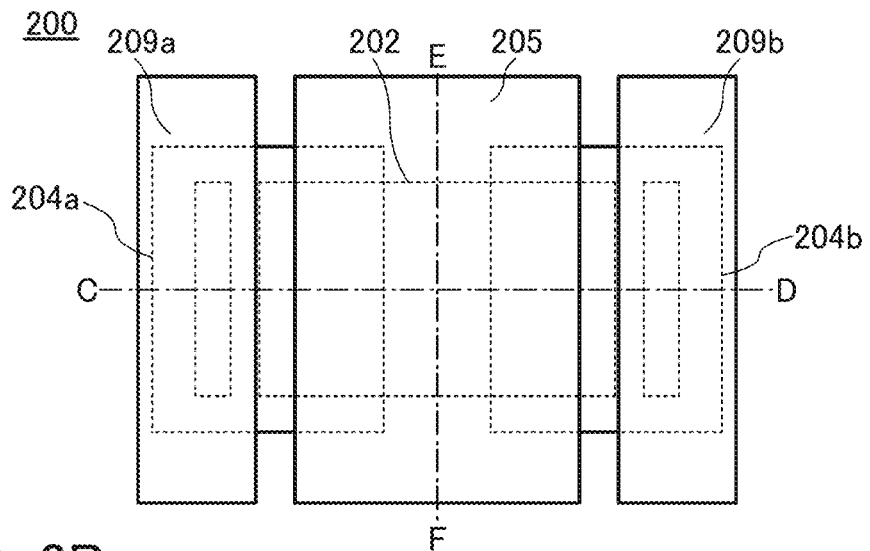
FIGS. 3A to 3C illustrate a structural example of a semiconductor device of an embodiment.
Figure 3B:
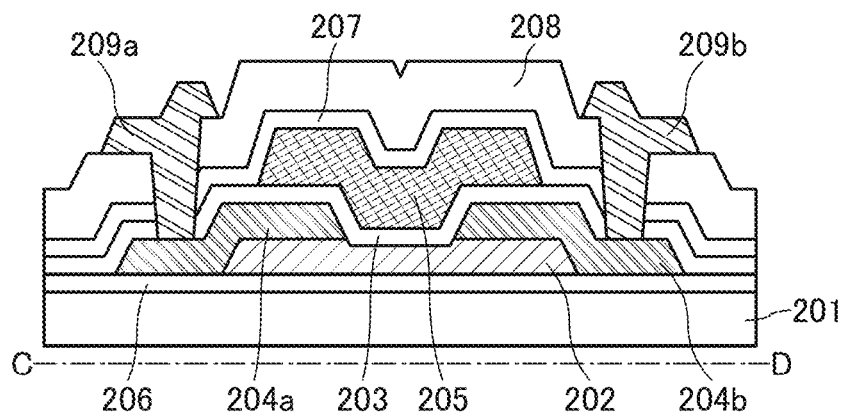
Figure 3C:
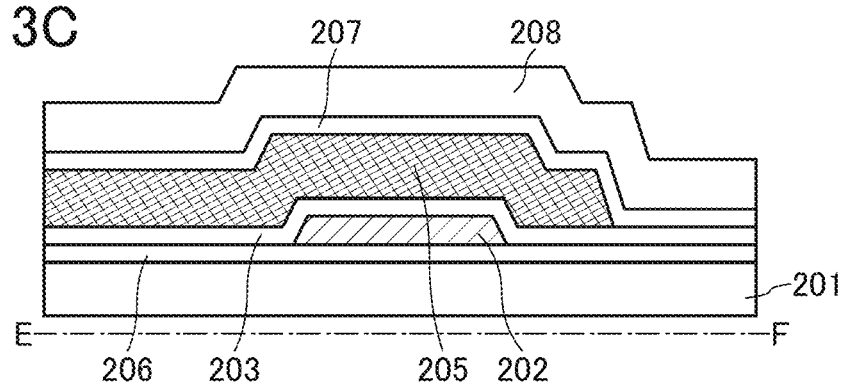

FIGS. 3A to 3C illustrate a transistor 200 that is an example described in this structural example. FIG. 3A is a schematic top view of the transistor 200. FIG. 3B is a schematic cross-sectional view taken along line C-D in FIG. 3A. FIG. 3C is a schematic cross-sectional view taken along line E-F in FIG. 3A.

The transistor 200 is formed over a substrate 201, and includes a semiconductor layer 202 over the substrate 201, a first electrode 204a and a second electrode 204b that are electrically connected to the semiconductor layer 202, an insulating layer 203 over the semiconductor layer 202, the first electrode 204a, and the second electrode 204b, and a gate electrode 205 that is over the insulating layer 203 and overlaps with the semiconductor layer 202.

Further, in the transistor 200, an insulating layer 206 is provided between the semiconductor layer 202 and the substrate 201. Furthermore, in the transistor 200, an insulating layer 207 and an insulating layer 208 are formed in this order over the gate electrode 205. Moreover, wirings 209a and 209b are provided over the insulating layer 208. The wiring 209a is electrically connected to the first electrode 204a through an opening provided in the insulating layers 208, 207, and 203. The wiring 209b is electrically connected to the second electrode 204b through an opening provided in the insulating layers 208, 207, and 203. The wirings 209a and 209b may be provided as needed and are not necessarily provided.

Examples of a semiconductor applicable to the semiconductor layer 202 in which a channel of the transistor 200 is formed include a semiconductor material such as silicon or germanium, a compound semiconductor material, an organic semiconductor material, and an oxide semiconductor material.

Further, there is no particular limitation on the crystallinity of a semiconductor used for the semiconductor layer 202, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

For example, in the case of using silicon as the semiconductor, amorphous silicon, microcrystalline silicon, polycrystalline silicon, single crystal silicon, or the like can be used.

In the case of using an oxide semiconductor as the semiconductor, an oxide semiconductor containing at least one of indium, gallium, and zinc is preferably used. Typically, an In—Ga—Zn-based metal oxide or the like can be given. An oxide semiconductor having a wider band gap and a lower carrier density than silicon is preferably used because off-state leakage current can be reduced.

A case in which an oxide semiconductor is used for the semiconductor layer 202 is described below.

<Substrate>

There is no particular limitation on the property of a material and the like of the substrate 201 as long as the material has heat resistance enough to withstand at least heat treatment performed later. For example, a glass substrate, a ceramic substrate, a quartz substrate, a sapphire substrate, or an yttria-stabilized zirconia (YSZ) substrate may be used as the substrate 201. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 201.

Still alternatively, a component in which a semiconductor element is provided over a semiconductor substrate or an SOI substrate may be used as the substrate 201. In this case, the transistor 200 is formed over the substrate 201 with an interlayer insulating layer provided therebetween. The transistor 200 in this case may have a structure in which at least one of the gate electrode 205, the first electrode 204a, and the second electrode 204b is electrically connected to the above semiconductor element by a connection electrode buried in the interlayer insulating layer. The transistor 200 is provided over the semiconductor element with the interlayer insulating layer provided therebetween, which can suppress an increase in area due to provision of the transistor 200.

Still alternatively, a flexible substrate such as a plastic substrate may be used as the substrate 201, and the transistor 200 may be provided directly on the flexible substrate. Further alternatively, a separation layer may be provided between the substrate 201 and the transistor 200. The separation layer can be used when part or the whole of the transistor is formed over the separation layer, separated from the substrate 201, and transferred to another substrate. Thus, the transistor 200 can be transferred to a substrate having low heat resistance or a flexible substrate.

<Gate Electrode>

The gate electrode 205 can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Furthermore, the gate electrode 205 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The gate electrode 205 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 205 and the insulating layer 203. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, as an In—Ga—Zn-based oxynitride semiconductor film, an In—Ga—Zn-based oxynitride semiconductor film having a higher nitrogen concentration than at least the semiconductor layer 202, specifically an In—Ga—Zn-based oxynitride semiconductor film having a nitrogen concentration higher than or equal to 7 atomic %, is used.

<Gate Insulating Layer>

The insulating layer 203 serves as a gate insulating layer.

The insulating layer 203 may be formed to have a single-layer structure or a stacked-layer structure using, for example, one or more of silicon oxide, silicon oxynitride, silicon nitride oxide, silicon nitride, aluminum oxide, hafnium oxide, gallium oxide, Ga—Zn-based metal oxide, silicon nitride, and the like.

The insulating layer 203 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

<First Electrode and Second Electrode>

The first electrode 204a and the second electrode 204b function as source and drain electrodes of the transistor 200.

The first electrode 204a and the second electrode 204b can be formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

<Insulating Layer>

The insulating layer 206 serves as a barrier layer that prevents diffusion of impurities contained in the substrate 201.

At least one of the insulating layers 206 and 207 is preferably formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 20^{20}$ atoms/cm$^3$ in thermal desorption spectroscopy (TDS) analysis.

As the insulating layer 206 or 207, for example, silicon oxide, silicon oxynitride, or the like can be used.

Note that the insulating layer 207 also functions as a film that relieves damage to the transistor at the time of forming the insulating layer 208 later.

An oxide film transmitting oxygen may be provided below the insulating layer 207.

As the oxide film transmitting oxygen, a silicon oxide film, a silicon oxynitride film, or the like can be formed. Note that in this specification, "silicon oxynitride film" refers to a film that contains more oxygen than nitrogen, and "silicon nitride oxide film" refers to a film that contains more nitrogen than oxygen.

The insulating layer 208 can be formed using an insulating film having a blocking effect against oxygen, hydrogen, water, and the like. It is possible to prevent outward diffusion of oxygen from the semiconductor layer 202 and entry of hydrogen, water, or the like into the semiconductor layer 202 from the outside by providing the insulating layer 208 over the insulating layer 207. As for the insulating film having a blocking effect against oxygen, hydrogen, water, and the like, a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

A structure that includes the above insulating film having a blocking effect of against oxygen, hydrogen, water, and the like as the insulating layer 207 and does not include the insulating layer 208 may be used. Alternatively, a stacked-layer structure including the insulating layer 207 having such a blocking effect and the insulating layer 208 may be used. The stacked-layer structure including the insulating layers 207 and 208 can improve the blocking effect and the planarity of the upper portion of the transistor 200.

<Semiconductor Layer>

An oxide semiconductor that can be favorably used for the semiconductor layer 202 is described.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

In the case where an oxide semiconductor film is used for a transistor, the thickness of the oxide semiconductor film is preferably greater than or equal to 2 nm and less than or equal to 40 nm.

An applicable oxide semiconductor preferably contains at least indium (In) or zinc (Zn). In particular, In and Zn are preferably contained. In addition, as a stabilizer for reducing variation in electrical characteristics of a transistor using the oxide semiconductor, one or more elements selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. Further, the In—Ga—Zn-based oxide may contain a metal element other than In, Ga, and Zn.

Alternatively, a material represented by $InMO_3(ZnO)_n$, (m>0 is satisfied, and m is not an integer) may be used as the oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0 is satisfied, and n is an integer) may be used.

For example, an In—Ga—Zn-based oxide with an atomic ratio of In:Ga:Zn=1:1:1, In:Ga:Zn=1:3:2, In:Ga:Zn=1:3:4, In:Ga:Zn=1:3:6, In:Ga:Zn=3:1:2, or In:Ga:Zn=2:1:3, or an oxide with an atomic ratio close to the above atomic ratios can be used.

When the oxide semiconductor film contains a large amount of hydrogen, the hydrogen and an oxide semiconductor are bonded to each other, so that part of the hydrogen serves as a donor and causes generation of an electron that is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (approximately 25° C.); or less than or equal to $1\times10^{-15}$ A, preferably less than or equal to $1\times10^{-18}$ A, further preferably less than or equal to $1\times10^{-21}$ A at 85° C. An off state of a transistor refers to a state where gate voltage is sufficiently lower than the threshold voltage in an n-channel transistor. Specifically, the transistor is in an off state when the gate voltage is lower than the threshold voltage by 1V or more, 2V or more, or 3V or more.

A structure of an oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) indicating alignment are observed. For example, when electron diffraction with an electron beam having a diameter of 1 nm or more and 30 nm or less (such electron diffraction is also referred to as nanobeam electron diffraction) is performed on the top surface of the CAAC-OS film, spots are observed.

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element (e.g., silicon) that has higher bonding strength to oxygen than a metal element included in the oxide semiconductor film disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. Note that charge trapped by the carrier traps in the oxide semiconductor film takes a long time to be released and might behave like fixed charge. Thus, a transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In an image obtained with a TEM, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an InGaZnO$_4$ crystal is analyzed by an out-of-plane method, peaks of 2θ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a boundary between crystal parts is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak that shows a crystal plane does not appear. Further, a halo pattern is shown in an electron diffraction pattern of the nc-OS film obtained by electron diffraction (also referred to as selected-area electron diffraction) using an electron beam having a probe diameter larger than the diameter of a crystal part (e.g., larger than or equal to 50 nm). Meanwhile, spots are shown in a nanobeam electron diffraction pattern of the nc-OS film obtained by electron diffraction (also referred to as nanobeam electron diffraction) using an electron beam having a probe diameter close to or smaller than the diameter of a crystal part (e.g., larger than or equal to 1 nm and smaller than equal to 30 nm). Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak that shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor film can be applied to a transistor that needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more films of an amorphous oxide semiconductor film, a microcrystalline oxide semiconductor film, and a CAAC-OS film, for example.

The above is the description of the structural examples of the transistor.

[Example of Manufacturing Method]

An example of a method for manufacturing the transistor 200 illustrated in FIG. 3A to 3C is described below with reference to the drawings. FIGS. 4A to 4E and FIGS. 5A to 5D are schematic cross-sectional views of respective steps of the example of the manufacturing method described below.

<Formation of Insulating Layer>

First, the insulating layer 206 is formed over the substrate 201.

The insulating layer 206 is formed by a sputtering method, a CVD method, an evaporation method, or the like.

In order to make the insulating layer 206 excessively contain oxygen, the insulating layer 206 may be formed in an oxygen atmosphere, for example. Alternatively, the insulating layer 206 may excessively contain oxygen in such a manner that oxygen is introduced into the insulating layer 206 that has been formed. Both the methods may be combined.

For example, oxygen (at least including any of oxygen radicals, oxygen atoms, and oxygen ions) is introduced into the insulating layer 206 that has been formed, whereby a region excessively containing oxygen is formed. As a method for introducing oxygen, an ion implantation method, an ion doping method, a plasma immersion ion implantation method, plasma treatment, or the like can be employed.

A gas containing oxygen can be used for oxygen introducing treatment. As the gas containing oxygen, oxygen, dinitrogen monoxide, nitrogen dioxide, carbon dioxide, carbon monoxide, and the like can be used. Further, a rare gas may be included in the gas containing oxygen for the oxygen introduction treatment.

<Formation of Semiconductor Layer>

Figure 4A:
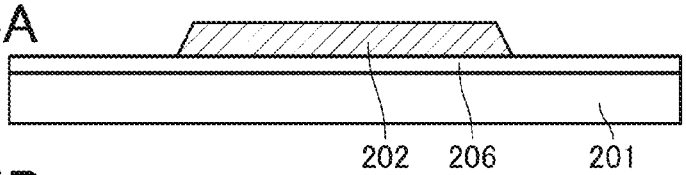
FIGS. 4A to 4E illustrate a method for manufacturing a semiconductor device of an embodiment.

An oxide semiconductor film is formed and then processed into an island shape by a processing method such as photolithography, so that the semiconductor layer 202 is formed (FIG. 4A).

The oxide semiconductor film can be formed by a sputtering method, a CVD method, a molecular beam epitaxy (MBE) method, an atomic layer deposition (ALD) method, a pulse laser deposition (PLD) method, or the like. The oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

Note that heat treatment may be performed after the formation of the oxide semiconductor film. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more in order to compensate released oxygen. By the heat treatment, oxygen is supplied from the insulating layer 206 to the oxide semiconductor film (or the semiconductor layer 202), which enables a reduction in oxygen vacancies in the oxide semiconductor included in the semiconductor layer 202. Note that the heat treatment may be performed at any timing after the formation of the oxide semiconductor film. The heat treatment may be performed before the processing of the oxide semiconductor film or may be performed after the formation of the semiconductor layer 202 by the processing of the oxide semiconductor film.

<Formation of Conductive Film>

Next, a conductive film 214 is formed over the insulating layer 206 and the semiconductor layer 202.

The conductive film 214 is to be the first electrode 204a and the second electrode 204b later. The conductive film is formed by a sputtering method or the like.

<Formation of Organic Coating Film and Resist Film>

Figure 4B:
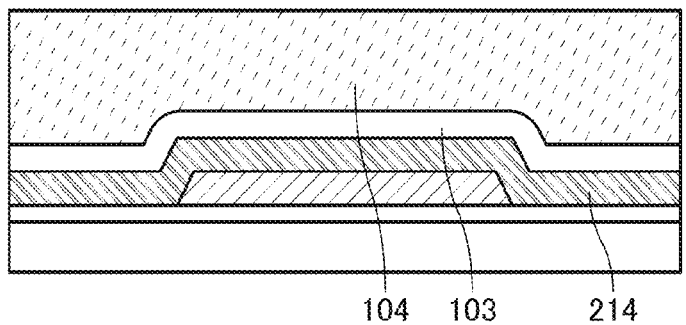

Next, the organic coating film 103 is formed over the conductive film 214. Then, the resist film 104 is formed over the organic coating film 103 (FIG. 4B). Embodiment 1 can be referred to for the methods for forming the organic coating film 103 and the resist film 104.

<Exposure and Development of Resist Film>

Figure 4C:
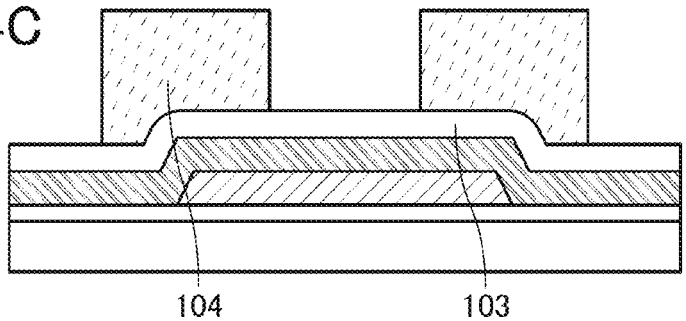

Next, the resist film 104 is exposed to light. In this example of the manufacturing method, a negative resist is used as the resist film, and exposure is performed by scanning of an electron beam. After that, development treatment is performed on the resist film 104, so that a non-exposure portion of the resist film 104 is removed (FIG. 4C).

<Formation of Organic Material Layer>

Figure 4D:
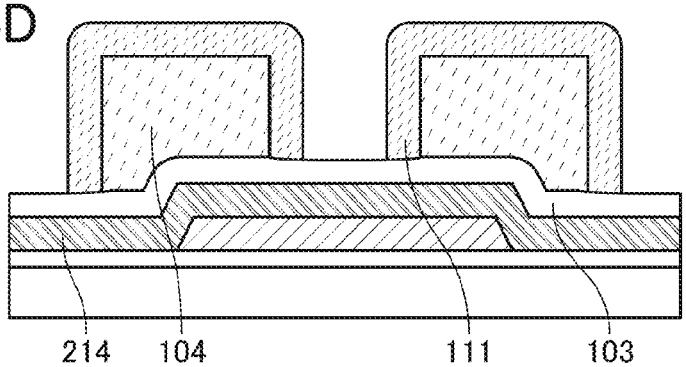

Then, the organic material layer 111 is formed on a surface of the resist film 104 (FIG. 4D). In this example of the manufacturing method, plasma treatment using a reaction gas containing $CHF_3$ is performed, so that the organic material layer 111 containing fluorocarbon polymer is deposited on the surface of the resist film 104.

<Etching of Organic Coating Film>

Next, part of the organic coating film 103 that is exposed is etched using the resist film 104 and the organic material layer 111 as masks, whereby the top surface of the conductive film 214 is partly exposed.

<Etching of Conductive Film>

Figure 4E:
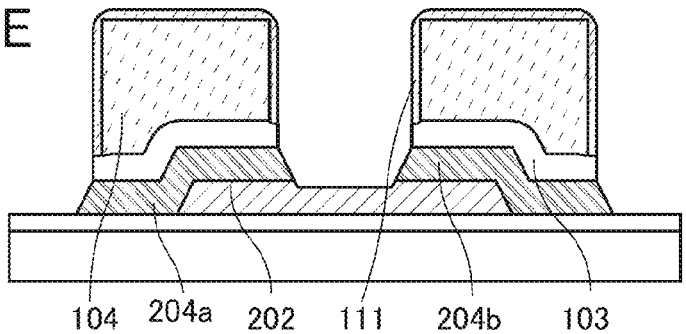

Then, the exposed portion of the conductive film 214 is etched using the resist film 104 and the organic material layer 111 as masks, whereby the first electrode 204a and the second electrode 204b are formed (FIG. 4E).

In this example of the manufacturing method, the plasma treatment for forming the organic material layer 111, the etching treatment on the organic coating film 103, and the etching treatment on the conductive film 214 are successively performed using the same apparatus. A gas containing $CHF_3$ is used as a reaction gas for the plasma treatment. A reaction gas containing $CF_4$ and oxygen is used for the etching of the organic coating film 103 and the conductive film 214.

In the case where an oxide semiconductor is used for the semiconductor layer 202, a gas that does not contain chlorine is preferably used as a reaction gas used for the plasma treatment and the etching treatment. The use of a reaction gas containing chlorine may improve the controllability and stability of the etching rate; however, when the semiconductor layer 202 is exposed to the air after the etching using a reaction gas containing chlorine, chlorine that remains on the surface exposed to the reaction gas may react with water in the air to generate hydrochloric acid, which corrodes the exposed surface of the semiconductor layer 202 in some cases. Thus, when a gas that does not contain chlorine is used as a reaction gas used for the plasma treatment and the etching treatment, an increase in the number of surface defects of the semiconductor layer 202 can be suppressed, which enables a highly reliable transistor to be obtained.

<Removal of Resist Film, Organic Coating Film, and Organic Material Layer>

Subsequently, the resist film 104, the organic coating film 103, and the organic material layer 111 are removed. In this example of the manufacturing method, they are removed by plasma treatment (also referred to as ashing) in an atmosphere containing oxygen.

In the case where an oxide semiconductor is used for the semiconductor layer 202, the resist film 104, the organic coating film 103, and the organic material layer 111 are preferably removed by the above-described plasma treatment. For example, a resist stripper that is often used for removing a resist is often alkaline, and the alkaline liquid corrodes the semiconductor layer 202 or etches part of the semiconductor layer 202 in some cases. Thus, when plasma treatment is used for removing the resist film 104 and the like, an increase in the number of surface defects of the semiconductor layer 202, an unintended reduction in thickness of the semiconductor layer 202, and the like can be suppressed, which enables a highly reliable transistor to be obtained.

<Formation of Gate Insulating Layer>

Figure 5A:
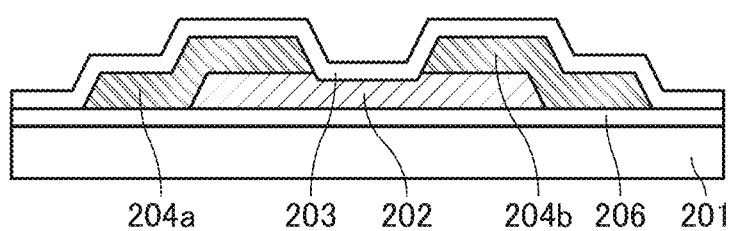
FIGS. 5A to 5D illustrate a method for manufacturing a semiconductor device of an embodiment.

Next, the insulating layer 203 is formed over the semiconductor layer 202, the first electrode 204a, and the second electrode 204b (FIG. 5A).

The insulating layer 203 can be formed by a sputtering method, a CVD method, an MBE method, an ALD method, a PLD method, or the like. In particular, it is preferable that the insulating layer 203 be formed by a CVD method, further preferably a plasma CVD method because coverage can be excellent.

After the formation of the insulating layer 203, heat treatment is preferably performed. By the heat treatment, an impurity such as water or hydrogen contained in the gate insulating layer 203 can be released (dehydration or dehydrogenation can be performed). The temperature of the heat treatment is preferably higher than or equal to 300° C. and lower than or equal to 400° C. The heat treatment is preferably performed in such a manner that heat treatment is performed in an inert gas atmosphere, and then another heat treatment is performed in an atmosphere containing an oxidizing gas at 10 ppm or more in order to compensate desorbed oxygen.

<Formation of Gate Electrode>

Figure 5B:
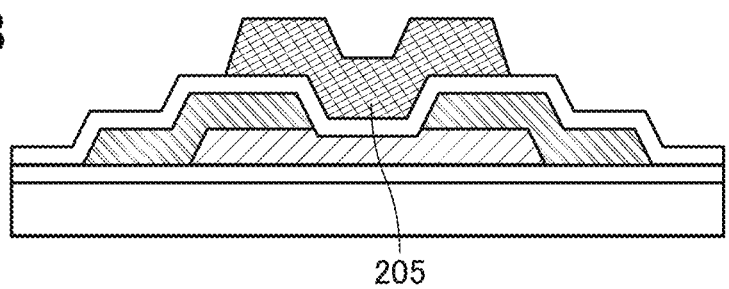

Next, a conductive film is formed over the insulating layer 203, and an unnecessary portion of the conductive film is etched by a processing method such as photolithography, so that the gate electrode 205 is formed (FIG. 5B).

The conductive film to be the gate electrode 205 is formed by a sputtering method or the like.

<Formation of Insulating Layer>

Figure 5C:
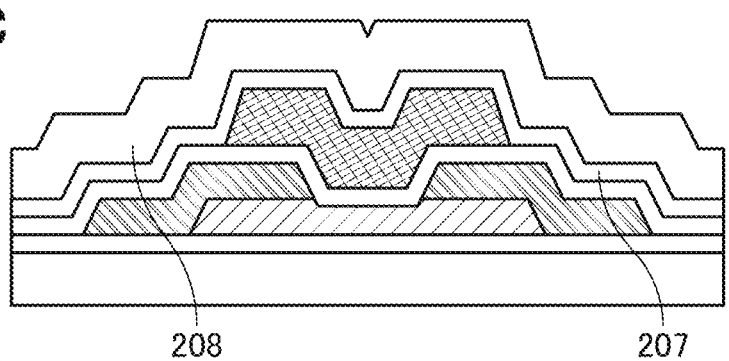
Figure 5D:
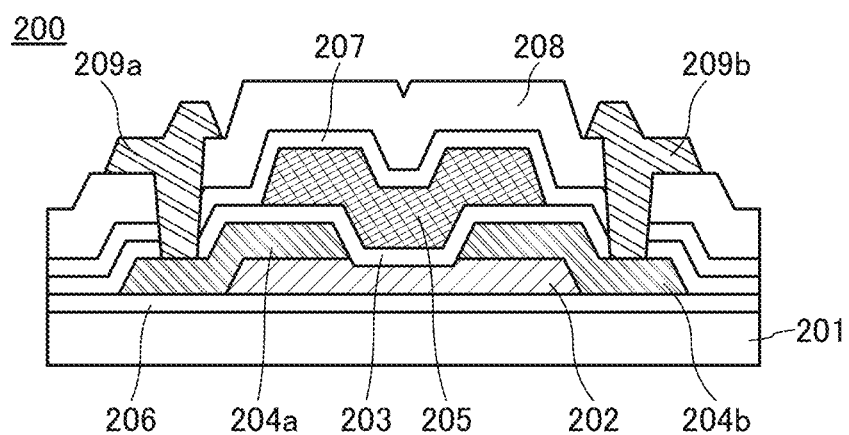

Next, the insulating layer 207 is formed over the insulating layer 203 and the gate electrode 205, and then the insulating layer 208 is formed over the insulating layer 207 (FIG. 5C).

The insulating layers 207 and 208 each can be formed by a sputtering method, a CVD method, an MBE method, an ALD method, a PLD method, or the like. In particular, it is preferable that the insulating layers 207 and 208 each be formed by a CVD method, further preferably a plasma CVD method, because favorable coverage can be obtained.

In the case of forming a silicon oxide film or a silicon oxynitride film as the insulating layer 207 by a plasma CVD method, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

For example, a silicon oxide film or a silicon oxynitride film is formed under the conditions as follows: the substrate placed in a vacuum-evacuated treatment chamber of a plasma CVD apparatus is held at a temperature higher than or equal to 180° C. and lower than or equal to 260° C., preferably higher than or equal to 200° C. and lower than or equal to 240° C., a source gas is introduced into the treatment chamber, the pressure is greater than or equal to 100 Pa and less than or equal to 250 Pa, preferably greater than or equal to 100 Pa and less than or equal to 200 Pa, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

As the film formation conditions, the high-frequency power having the above power density is supplied to the treatment chamber having the above pressure, whereby the decomposition efficiency of the source gas in plasma is increased, oxygen radicals are increased, and oxidation of the source gas is promoted; therefore, oxygen is contained in the oxide insulating film at a higher proportion than oxygen in the stoichiometric composition. However, in the case where the substrate temperature is within the above temperature range, the bond between silicon and oxygen is weak, and accordingly, part of oxygen is released by heating. Thus, it is possible to form an oxide insulating film that contains oxygen at a higher proportion than the stoichiometric composition and from which part of oxygen is released by heating.

In the case where the insulating layer 208 is formed using a silicon nitride film or a silicon nitride oxide film, a deposition gas containing silicon, an oxidizing gas, and a gas containing nitrogen are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples. As the gas containing nitrogen, nitrogen and ammonia can be given as examples.

After the formation of the insulating layers 207 and 208, heat treatment is preferably performed. Oxygen released from the insulating layer 207 by heat treatment is supplied to the semiconductor layer 202, which enables a reduction in oxygen vacancies in the oxide semiconductor included in the semiconductor layer 202.

<Formation of Wiring>

Next, the insulating layers 208, 207, and 203 are partly etched, so that openings reaching the first electrode 204a and the second electrode 204b are formed.

Then, a conductive film is formed over the insulating layer 208, the first electrode 204a, and the second electrode 204b, and the conductive film is partly etched by a processing method such as photolithography, so that the wirings 209a and 209b are formed.

For the conductive film to be the wirings 209a and 209b, a conductive material that can be used for any of the gate electrode 205, the first electrode 204a, and the second electrode 204b may be used. The conductive film can be formed by a sputtering method, or the like.

Through the above steps, the transistor 200 can be manufactured.

In the transistor 200 manufactured by such a method, CD loss can be substantially eliminated at the processing for forming the first electrode 204a and the second electrode 204b. Thus, the distance (also referred to as a channel length L of the transistor) between the first electrode 204a and the second electrode 204b may be a designed size on account of stable processing, which can reduce variation in electrical characteristics of the transistor.

Further, the channel length L of the transistor can be shorter than the minimum feature size. For example, even in the case where the minimum feature size of the channel length L of the transistor is approximately 20 nm to 30 nm because of various limitations due to a light-exposure apparatus, a light source, and a material of a resist film, a transistor having a channel length L as small as 25 nm or smaller, 20 nm or smaller, 18 nm or smaller, 15 nm or smaller, or 12 nm or smaller can be obtained.

MODIFICATION EXAMPLE

An example of a transistor having a different structure from the transistor 200 is described below. Note that descriptions of components having structures or functions similar to those of the above, which are denoted by the same reference numerals, are omitted below.

Modification Example 1

Figure 6A:
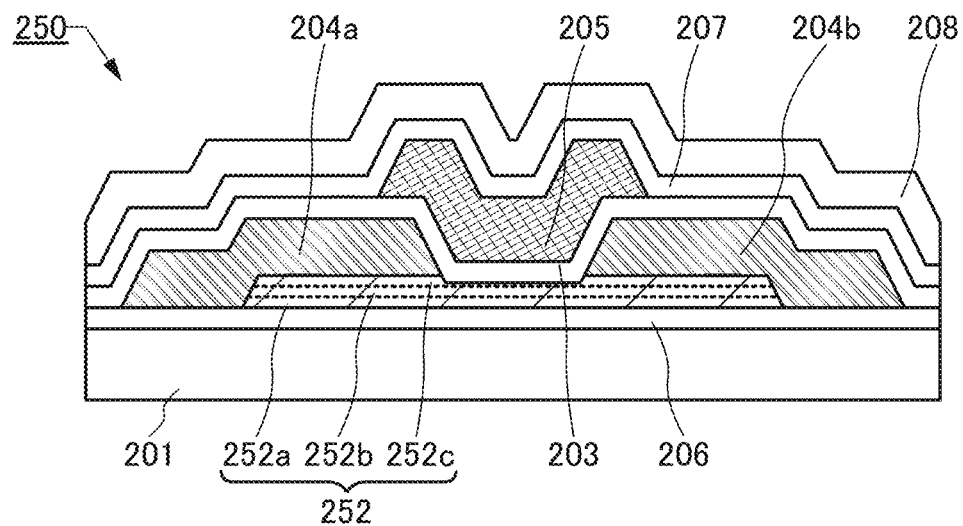
FIGS. 6A and 6B illustrate structural examples of a semiconductor device of an embodiment.

FIG. 6A is a schematic cross-sectional view of a transistor 250 described below as an example. The structure of a semiconductor layer in the transistor 250 is different from that in the transistor 200.

A case where the wirings 209a and 209b are not provided is described below; however, openings reaching the first electrode 204a and the second electrode 204b may be formed in the insulating layers over the first electrode 204a and the second electrode 204b, and wirings may be provided over the insulating layers as needed.

The transistor 250 includes a semiconductor layer 252 over the substrate 201 with the insulating layer 206 positioned therebetween; the first electrode 204a and the second electrode 204b that are in contact with the top surface of the semiconductor layer 252; the insulating layer 203 over the semiconductor layer 252, the first electrode 204a, and the second electrode 204b; and the gate electrode 205 that is over the insulating layer 203 and overlaps with the semiconductor layer 252. Moreover, insulating layers 207 and 208 are provided to cover the insulating layer 203 and the gate electrode 205.

In the semiconductor layer 252 included in the transistor 250, a semiconductor layer 252a, a semiconductor layer 252b, and a semiconductor layer 252c are stacked in this order.

A boundary between the semiconductor layers 252a and 252b and a boundary between the semiconductor layers 252b and 252c are unclear in some cases; thus, these boundaries are shown by dashed lines in FIG. 6A and the like.

For example, for the semiconductor layer 252b, an In—Ga oxide, an In—Zn oxide, or an In-M-Zn oxide (M represents Al, Ti, Ga, Y, Zr, La, Ce, Nd, or Hf) is typically used. In the case of using an In-M-Zn oxide as the semiconductor layer 252b, when summation of In and M is assumed to be 100 atomic %, the proportions of In and M are preferably greater than or equal to 25 atomic % and less than 75 atomic %, respectively, and more preferably greater than or equal to 34 atomic % and less than 66 atomic %, respectively. Further, for the semiconductor layer 252b, a material having an energy gap of 2 eV or more, preferably 2.5 eV or more, further preferably 3 eV or more is used, for example.

For example, the oxide semiconductor layer 252a contains In or Ga and typically is an In—Ga oxide, an In—Zn oxide, or an In-M-Zn oxide (M represents Al, Ti, Ga, Y, Zr, La, Ce, Nd, or Hf). The energy of the conduction band bottom is closer to a vacuum level than that of the oxide semiconductor layer 252b is, and typically, the difference between the energy of the conduction band bottom of the oxide semiconductor layer 252b and the energy of the conduction band bottom of the oxide semiconductor layer 252a is preferably 0.05 eV or more, 0.07 eV or more, 0.1 eV or more, or 0.15 eV or more and 2 eV or less, 1 eV or less, 0.5 eV or less, or 0.4 eV or less.

For example, the oxide semiconductor layer 252c contains In or Ga and typically is an In—Ga oxide, an In—Zn oxide, or an In-M-Zn oxide (M represents Al, Ti, Ga, Y, Zr, La, Ce, Nd, or Hf). The energy of the conduction band bottom is closer to a vacuum level than that of the oxide semiconductor layer 252b is, and typically, the difference between the energy of the conduction band bottom of the oxide semiconductor layer 252b and the energy of the conduction band bottom of the oxide semiconductor layer 252c is preferably 0.05 eV or more, 0.07 eV or more, 0.1 eV or more, or 0.15 eV or more and 2 eV or less, 1 eV or less, 0.5 eV or less, or 0.4 eV or less.

When an In-M-Zn oxide is used for the semiconductor layer 252a, the proportions of In and M when summation of In and M is assumed to be 100 atomic % is preferably as follows: the atomic percentage of In is less than 50 atomic % and the atomic percentage of M is greater than or equal to 50 atomic %; further preferably, the atomic percentage of In is less than 25 atomic % and the atomic percentage of M is greater than or equal to 75 atomic %.

For example, as the oxide semiconductor layer 252b, an In—Ga—Zn oxide in which an atomic ratio of In to Ga and Zn is 1:1:1 or 3:1:2 can be used. For the semiconductor layer 252a or 252c, an In—Ga—Zn oxide containing In, Ga, and Zn at an atomic ratio of 1:3:4, 1:3:6, 1:6:8, or 1:6:10 can be used, for example. Note that the atomic ratio of each of the semiconductor layers 252a, 252b, and 252c varies within a range of ±20% as an error.

For each of the semiconductor layers 252a and 252c between which the semiconductor layer 252b is sandwiched, an oxide that contains a larger amount of Ga serving as a stabilizer than the semiconductor layer 252b is used, which can suppress release of oxygen from the semiconductor layer 252.

Note that, without limitation to that described above, a material with an appropriate composition may be used depending on required semiconductor characteristics and electrical characteristics (e.g., field-effect mobility and threshold voltage) of a transistor. Further, in order to obtain the required semiconductor characteristics of the transistor, it is preferable that the carrier density, the impurity concentration, the defect density, the atomic ratio of a metal element to oxygen, the interatomic distance, the density, and the like of the semiconductor layers 252a, 252b, and 252c be set to appropriate values.

Although a structure in which three oxide semiconductor layers are stacked is described above as an example of the semiconductor layer 252, a structure in which two or four or more oxide semiconductor layers are stacked can also be employed.

Here, a method for processing a thin film of one embodiment of the present invention can be applied to the formation of the first electrode 204a and the second electrode 204b.

Modification Example 2

Figure 6B:
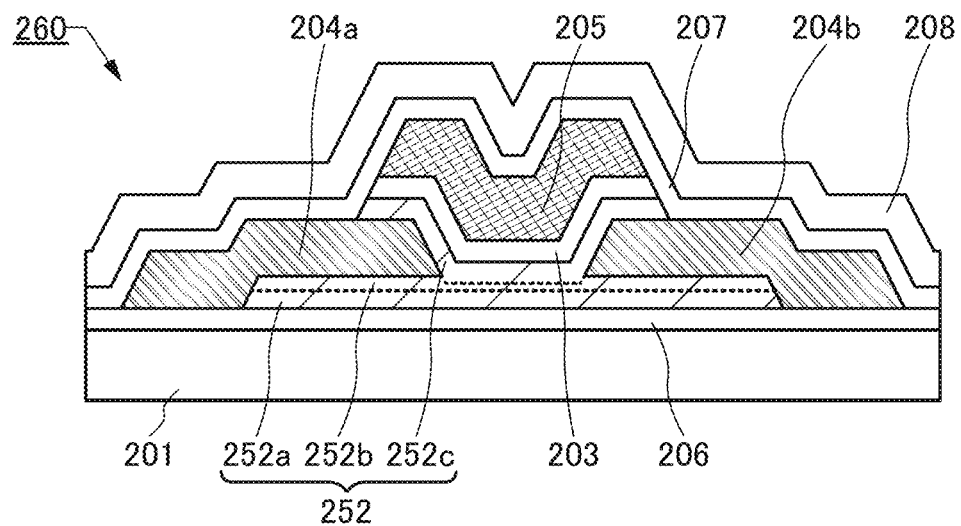

FIG. 6B is a schematic cross-sectional view of a transistor 260 described below as an example. The transistor 260 differs from the transistor 250 mainly in the structures of a semiconductor layer, a gate insulating layer, and the like.

The semiconductor layer 252c of the semiconductor layer 252 included in the transistor 260 is provided to cover the semiconductor layer 252b and end portions of the first electrode 204a and the second electrode 204b.

To substantially align end portions of the semiconductor layer 252c and the insulating layer 203 with an end portion of the gate electrode 205, the semiconductor layer 252c, the insulating layer 203, and the gate electrode 205 are processed using the same photomask.

The insulating layer 207 is provided in contact with side surfaces of the insulating layer 203 and the semiconductor layer 252c.

Here, a method for processing a thin film of one embodiment of the present invention can be applied to the formation of the first electrode 204a and the second electrode 204b.

Modification Example 3

Figure 7A:
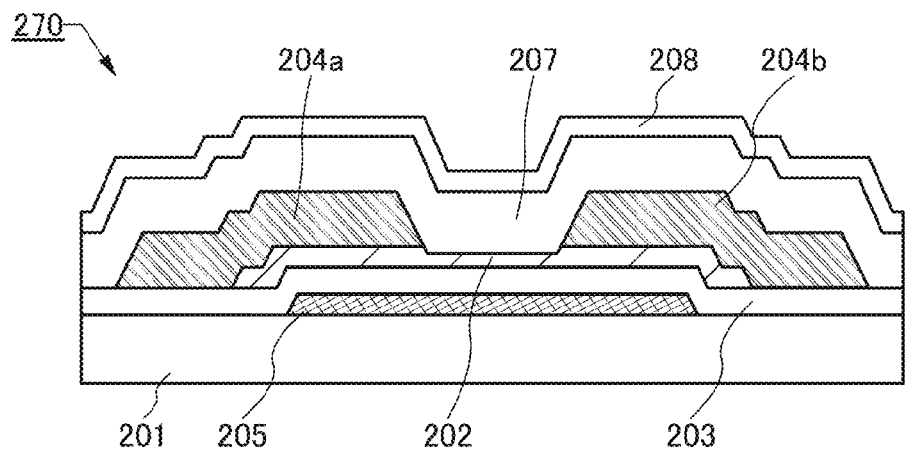
FIGS. 7A to 7C illustrate structural examples of a semiconductor device of an embodiment.

FIG. 7A is a schematic cross-sectional view of a transistor 270 described as an example below. The transistor 270 illustrated in FIG. 7A is a bottom-gate transistor.

The transistor 270 includes the gate electrode 205 over the substrate 201, the insulating layer 203 over the gate electrode 205, the semiconductor layer 202 over the insulating layer 203, and the first electrode 204a and the second electrode 204b over the semiconductor layer 202. Further, the insulating layer 207 is provided over the first electrode 204a, the second electrode 204b, and the semiconductor layer 202, and the insulating layer 208 is provided over the insulating layer 207.

Here, a method for processing a thin film of one embodiment of the present invention can be applied to the formation of the first electrode 204a and the second electrode 204b.

Modification Example 4

Figure 7B:
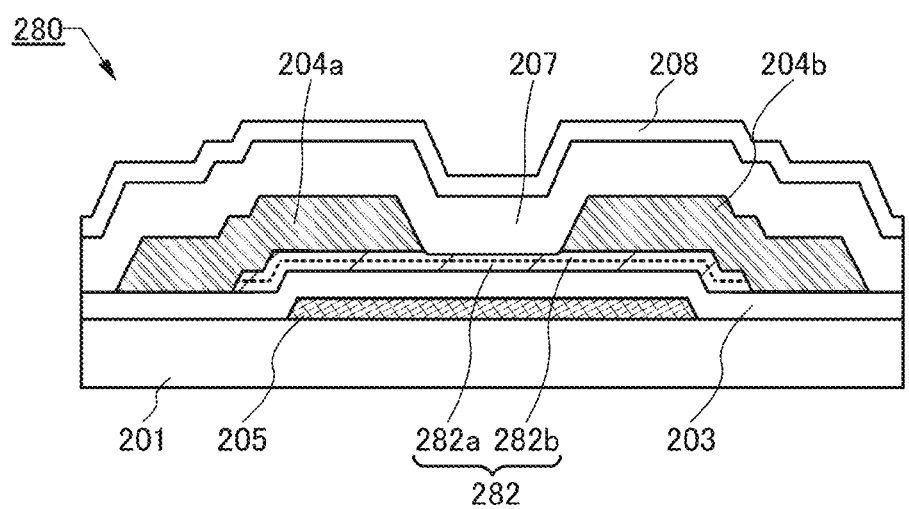

FIG. 7B is a schematic cross-sectional view of a transistor 280 described as an example below. The transistor 280 differs from the transistor 270 mainly in the structure of a semiconductor layer.

A semiconductor layer 282 of the transistor 280 has a stacked-layer structure in which a semiconductor layer 282a and a semiconductor layer 282b are stacked in this order.

For example, the semiconductor layer 282a can have a structure similar to that of the semiconductor layer 252a or 252c described in Modification example 1. For example, the semiconductor layer 282b can have a structure similar to that of the semiconductor layer 252b described in Modification example 1.

For example, an oxide that contains a large amount of Ga serving as a stabilizer is used for the semiconductor layer 282a provided below the semiconductor layer 282b, whereby release of oxygen from the semiconductor layers 282a and 282b can be suppressed.

In the case where a channel is mainly formed in the oxide semiconductor layer 282b, for example, an oxide containing a large amount of In can be used for the oxide semiconductor layer 282b and the first electrode 204a and the second electrode 204b are provided in contact with the oxide semiconductor layer 282b; thus, the on-state current of the transistor 280 can be increased.

Here, a method for processing a thin film of one embodiment of the present invention can be applied to the formation of the first electrode 204a and the second electrode 204b.

Modification Example 5

Figure 7C:
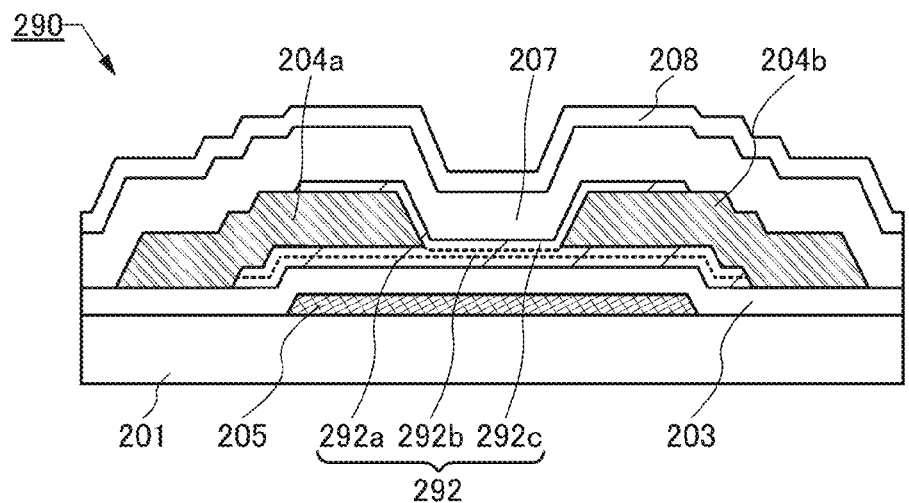

FIG. 7C is a schematic cross-sectional view of a transistor 290 described as an example below. The structure of an oxide semiconductor layer in the transistor 290 is different from those in the transistors 270 and 280.

A semiconductor layer 292 of the transistor 290 has a stacked-layer structure in which a semiconductor layer 292a, a semiconductor layer 292b, and a semiconductor layer 292c are stacked in this order.

The semiconductor layer 292a and the semiconductor layer 292b are stacked over the insulating layer 203. Further, the semiconductor layer 292c is provided in contact with the top surface of the semiconductor layer 292b and the top and side surfaces of the first electrode 204a and the second electrode 204b.

For example, the semiconductor layer 292b can have a structure similar to that of the semiconductor layer 252b described in Modification example 1. For example, the semiconductor layer 292a can have a structure similar to that of the semiconductor layer 252a described in Modification example 1. For example, the semiconductor layer 292c can have a structure similar to that of the semiconductor layer 252c described in Modification example 1.

For example, an oxide that contains a large amount of Ga serving as a stabilizer is used for each of the semiconductor layer 292a provided below the semiconductor layer 292b and the semiconductor layer 292c provided over the semiconductor layer 292b, whereby release of oxygen from the semiconductor layers 292a, 292b, and 292c can be suppressed.

In the case where a channel is mainly formed in the semiconductor layer 292b, for example, an oxide containing a large amount of In can be used for the semiconductor layer 292b and the first electrode 204a and the second electrode 204b are provided in contact with the semiconductor layer 292b; thus, the on-state current of the transistor 290 can be increased.

Here, a method for processing a thin film of one embodiment of the present invention can be applied to the formation of the first electrode 204a and the second electrode 204b.

The above is the description of the modification examples of the transistor.

Note that this embodiment can be combined with any of the other embodiments and examples described in this specification as appropriate.

Embodiment 3

In this embodiment, a structural example of a display panel that includes a semiconductor device manufactured by a method for manufacturing a semiconductor device of one embodiment of the present invention is described.

Structural Example

Figure 8A:
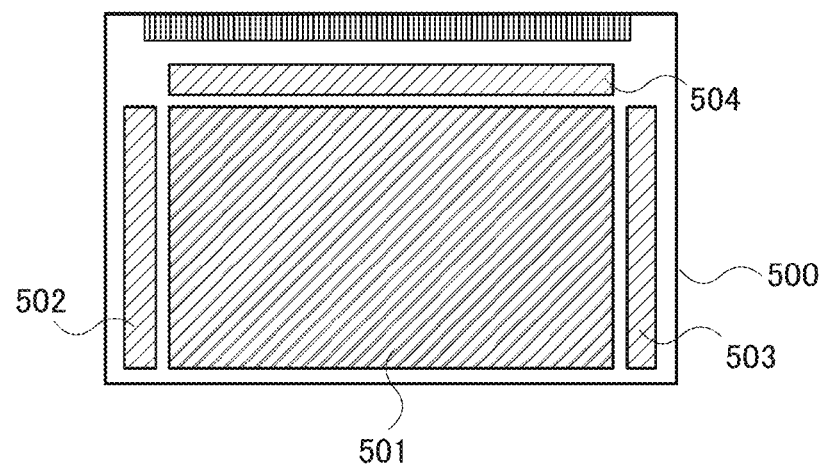
FIGS. 8A to 8C illustrate a structural example of a display panel of an embodiment.
Figure 8B:
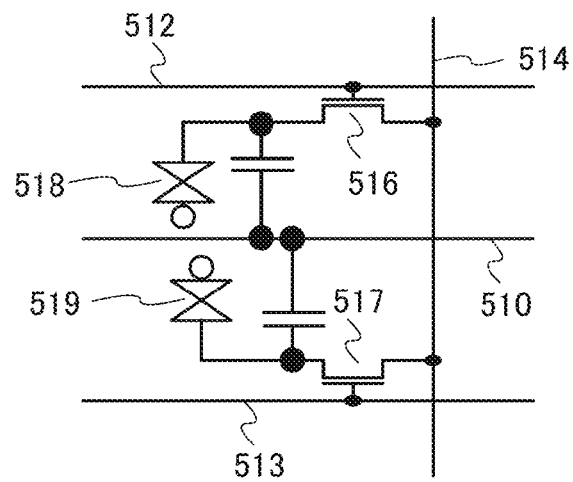
Figure 8C:
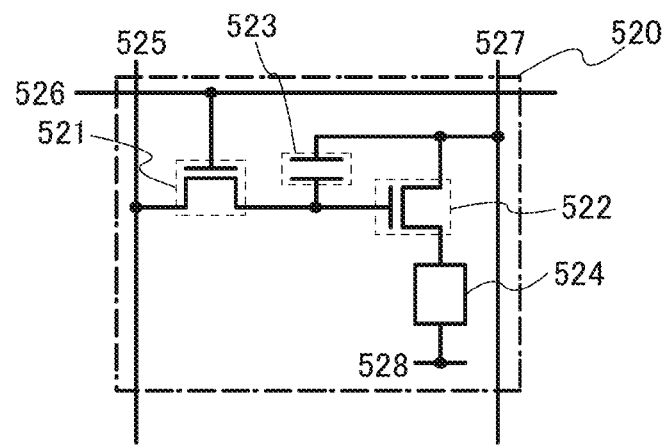

FIG. 8A is a top view of the display panel of one embodiment of the present invention. FIG. 8B is a circuit diagram for illustrating a pixel circuit that can be used in the case where a liquid crystal element is used in a pixel in the display panel of one embodiment of the present invention. FIG. 8C is a circuit diagram for illustrating a pixel circuit that can be used in the case where an organic EL element is used in a pixel in the display panel of one embodiment of the present invention.

The transistor in the pixel portion can be formed in accordance with Embodiment 2. Further, the transistor can be easily formed as an n-channel transistor, and thus part of a driver circuit that can be formed using an n-channel transistor can be formed over the same substrate as the transistor of the pixel portion. With the use of the transistor described in Embodiment 2 for the pixel portion or the driver circuit in this manner, a highly reliable display device can be provided.

FIG. 8A illustrates an example of a block diagram of an active matrix display device. A pixel portion 501, a first scan line driver circuit 502, a second scan line driver circuit 503, and a signal line driver circuit 504 are provided over a substrate 500 in the display device. In the pixel portion 501, a plurality of signal lines extended from the signal line driver circuit 504 are arranged and a plurality of scan lines extended from the first scan line driver circuit 502 and the second scan line driver circuit 503 are arranged. Note that pixels that include display elements are provided in a matrix in respective regions where the scan lines and the signal lines intersect with each other. The substrate 500 of the display device is connected to a timing control circuit (also referred to as a controller or a controller IC) through a connection portion such as a flexible printed circuit (FPC).

In FIG. 8A, the first scan line driver circuit 502, the second scan line driver circuit 503, and the signal line driver circuit 504 are formed over the same substrate 500 as the pixel portion 501. Accordingly, the number of components that are provided outside, such as a drive circuit, is reduced, so that a reduction in cost can be achieved. Further, in the case where the driver circuit is provided outside the substrate 500, wirings would need to be extended and the number of connections of wirings would be increased. When the driver circuit is provided over the substrate 500, the number of connections of the wirings can be reduced. Consequently, an improvement in reliability or yield can be achieved.

<Liquid Crystal Panel>

FIG. 8B illustrates an example of a circuit configuration of the pixel. Here, a pixel circuit that is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 512 of a transistor 516 and a gate wiring 513 of a transistor 517 are separated so that different gate signals can be supplied thereto. In contrast, a source or drain electrode layer 514 functioning as a data line is shared by the transistors 516 and 517. The transistor described in Embodiment 2 can be used as appropriate as each of the transistors 516 and 517. Thus, a highly reliable liquid crystal display panel can be provided.

The shapes of a first pixel electrode layer electrically connected to the transistor 516 and a second pixel electrode layer electrically connected to the transistor 517 are described. The first pixel electrode layer and the second pixel electrode layer are separated by a slit. The first pixel electrode layer has a V shape and the second pixel electrode layer is provided so as to surround the first pixel electrode layer.

A gate electrode of the transistor 516 is connected to the gate wiring 512, and a gate electrode of the transistor 517 is connected to the gate wiring 513. When different gate signals are supplied to the gate wiring 512 and the gate wiring 513, operation timings of the transistor 516 and the transistor 517 can be varied. As a result, alignment of liquid crystals can be controlled.

Further, a storage capacitor may be formed using a capacitor wiring 510, a gate insulating film functioning as a dielectric, and a capacitor electrode electrically connected to the first pixel electrode layer or the second pixel electrode layer.

The multi-domain pixel includes a first liquid crystal element 518 and a second liquid crystal element 519. The first liquid crystal element 518 includes the first pixel electrode layer, a counter electrode layer, and a liquid crystal layer therebetween. The second liquid crystal element 519 includes the second pixel electrode layer, a counter electrode layer, and a liquid crystal layer therebetween.

Note that a pixel circuit of the present invention is not limited to that shown in FIG. 8B. For example, a switch, a resistor, a capacitor, a transistor, a sensor, a logic circuit, or the like may be added to the pixel illustrated in FIG. 8B. A semiconductor device manufactured by a method for manufacturing a semiconductor device of one embodiment of the present invention can be used also for an element or a circuit included in the pixel circuit.

<Organic EL Panel>

FIG. 8C illustrates another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 8C illustrates an applicable example of a pixel circuit. Here, one pixel includes two n-channel transistors manufactured by a method for manufacturing a semiconductor device of one embodiment of the present invention. Further, digital time grayscale driving can be employed for the pixel circuit.

The configuration of the applicable pixel circuit and operation of a pixel employing digital time grayscale driving are described.

A pixel 520 includes a switching transistor 521, a driver transistor 522, a light-emitting element 524, and a capacitor 523. A gate electrode layer of the switching transistor 521 is connected to a scan line 526, a first electrode (one of a source electrode layer and a drain electrode layer) of the switching transistor 521 is connected to a signal line 525, and a second electrode (the other of the source electrode layer and the drain electrode layer) of the switching transistor 521 is connected to a gate electrode layer of the driver transistor 522. The gate electrode layer of the driver transistor 522 is connected to a power supply line 527 through the capacitor 523, a first electrode of the driver transistor 522 is connected to the power supply line 527, and a second electrode of the driver transistor 522 is connected to a first electrode (a pixel electrode) of the light-emitting element 524. A second electrode of the light-emitting element 524 corresponds to a common electrode 528. The common electrode 528 is electrically connected to a common potential line provided over the same substrate.

As the switching transistor 521 and the driver transistor 522, the transistor described in Embodiment 2 can be used as appropriate. In this manner, a highly reliable organic EL display panel can be provided.

The potential of the second electrode (the common electrode 528) of the light-emitting element 524 is set to be a low power supply potential. Note that the low power supply potential is lower than a high power supply potential supplied to the power supply line 527. For example, the low power supply potential can be GND, 0V, or the like. The high power supply potential and the low power supply potential are set to be higher than or equal to the forward threshold voltage of the light-emitting element 524, and the difference between the potentials is applied to the light-emitting element 524, whereby current is supplied to the light-emitting element 524, leading to light emission. The forward voltage of the light-emitting element 524 indicates a voltage at which a desired luminance is obtained, and includes at least a forward threshold voltage.

Note that gate capacitance of the driver transistor 522 may be used as a substitute for the capacitor 523, so that the capacitor 523 can be omitted. The gate capacitance of the driver transistor 522 may be formed between the channel formation region and the gate electrode layer.

Next, a signal input to the driver transistor 522 is described. In the case of a voltage-input voltage driving method, a video signal for turning on or off the driver transistor 522 is input to the driver transistor 522. In order for the driver transistor 522 to operate in a linear region, voltage higher than the voltage of the power supply line 527 is applied to the gate electrode layer of the driver transistor 522. Note that voltage higher than or equal to voltage that is the sum of power supply line voltage and the threshold voltage Vth of the driver transistor 522 is applied to the signal line 525.

In the case of performing analog grayscale driving, a voltage greater than or equal to a voltage that is the sum of the forward voltage of the light-emitting element 524 and the threshold voltage Vth of the driver transistor 522 is applied to the gate electrode layer of the driver transistor 522. A video signal by which the driver transistor 522 is operated in a saturation region is input, so that current is supplied to the light-emitting element 524. In order for the driver transistor 522 to operate in a saturation region, the potential of the power supply line 527 is set higher than the gate potential of the driver transistor 522. When an analog video signal is used, it is possible to supply current to the light-emitting element 524 in accordance with the video signal and perform analog grayscale driving.

Note that the configuration of the pixel circuit of the present invention is not limited to that shown in FIG. 8C. For example, a switch, a resistor, a capacitor, a sensor, a transistor, a logic circuit, or the like may be added to the pixel circuit illustrated in FIG. 8C. A semiconductor device manufactured by a method for manufacturing a semiconductor device of one embodiment of the present invention can be used also for an element or a circuit included in the pixel circuit.

Note that this embodiment can be combined with any of the other embodiments and examples described in this specification as appropriate.

Embodiment 4

In this embodiment, structural examples of electronic devices each of which includes a semiconductor device manufactured by a method for manufacturing a semiconductor device of one embodiment of the present invention are described.

Figure 9:
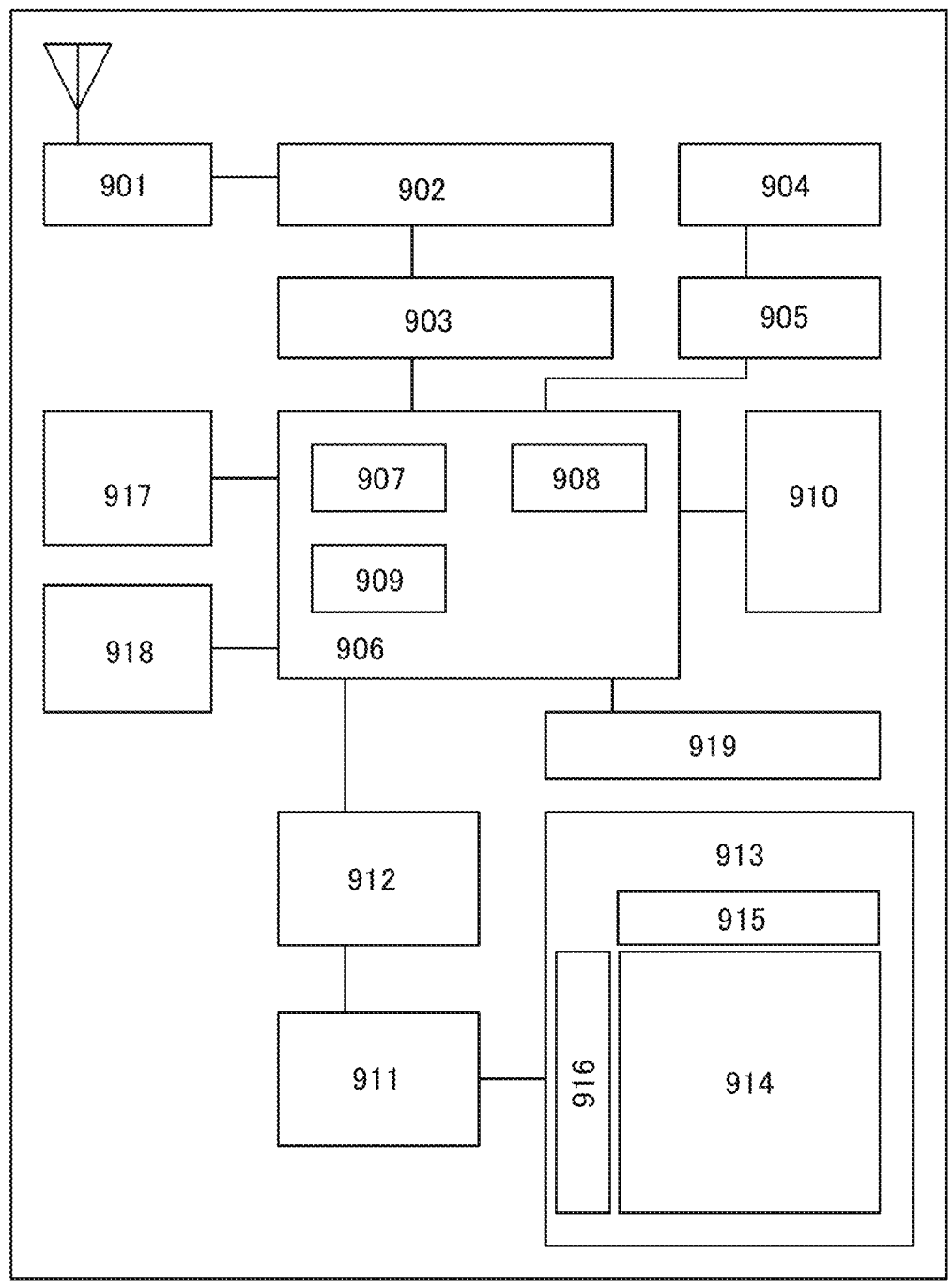
FIG. 9 illustrates a structural example of an electronic device of an embodiment.

FIG. 9 is a block diagram of an electronic device including a semiconductor device manufactured by a method for manufacturing a semiconductor device of one embodiment of the present invention.

FIGS. 10A to 10D are external views of electronic devices each including a semiconductor device manufactured by a method for manufacturing a semiconductor device of one embodiment of the present invention.

An electronic device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like.

The application processor 906 includes a CPU 907, a DSP 908, and an interface (IF) 909. Moreover, the memory circuit 912 can include an SRAM or a DRAM.

The transistor described in Embodiment 2 is applied to the memory circuit 912, whereby a highly reliable electronic device that can write and read data can be provided.

The transistor described in Embodiment 2 is applied to a register or the like included in the CPU 907 or the DSP 908, whereby a highly reliable electronic device that can write and read data can be provided.

Note that in the case where the off-state leakage current of the transistor described in Embodiment 2 is extremely small, the memory circuit 912 can store data for a long time and can have sufficiently reduced power consumption. Moreover, the CPU 907 or the DSP 908 can store the state before power gating in a register or the like during a period in which the power gating is performed.

Further, the display 913 includes a display portion 914, a source driver 915, and a gate driver 916.

The display portion 914 includes a plurality of pixels arranged in a matrix. The pixel includes a pixel circuit, and the pixel circuit is electrically connected to the gate driver 916.

The transistor described in Embodiment 2 can be used as appropriate in the pixel circuit or the gate driver 916. Accordingly, a highly reliable display can be provided.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 10A:
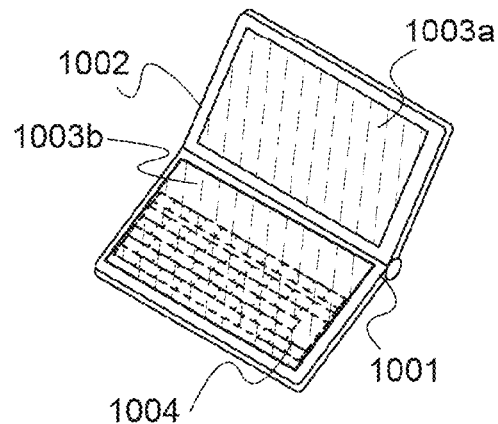
FIGS. 10A to 10D illustrate structural examples of electronic devices of an embodiment.

FIG. 10A illustrates a portable information terminal, which includes a main body 1001, a housing 1002, a display portion 1003a, a display portion 1003b, and the like. The display portion 1003b includes a touch panel. By touching a keyboard button 1004 displayed on the display portion 1003b, screen operation can be carried out, and text can be input. Needless to say, the display portion 1003a may function as a touch panel. A liquid crystal panel or an organic light-emitting panel is fabricated using the transistor described in Embodiment 2 as a switching element and applied to the display portion 1003a or 1003b, whereby a highly reliable portable information terminal can be provided.

The portable information terminal illustrated in FIG. 10A can have a function of displaying a variety of kinds of data (e.g., a still image, a moving image, and a text image), a function of displaying a calendar, a date, the time, or the like on the display portion, a function of operating or editing data displayed on the display portion, a function of controlling processing by a variety of kinds of software (programs), and the like. Further, an external connection terminal (an earphone terminal, a USB terminal, or the like), a recording medium insertion portion, or the like may be provided on the back surface or the side surface of the housing.

The portable information terminal illustrated in FIG. 10A may transmit and receive data wirelessly. Through wireless communication, desired book data or the like can be purchased and downloaded from an electronic book server.

Figure 10B:
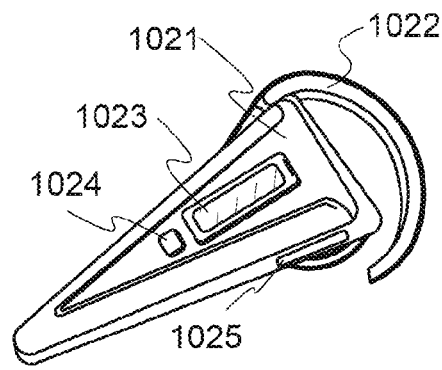

FIG. 10B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using the transistor described in Embodiment 2 as a switching element and applied to the display portion 1023, whereby a highly reliable portable music player can be provided.

Furthermore, when the portable music player illustrated in FIG. 10B has an antenna, a microphone function, or a wireless communication function and is used with a mobile phone, a user can talk on the phone wirelessly in a hands-free way while driving a car or the like.

Figure 10C:
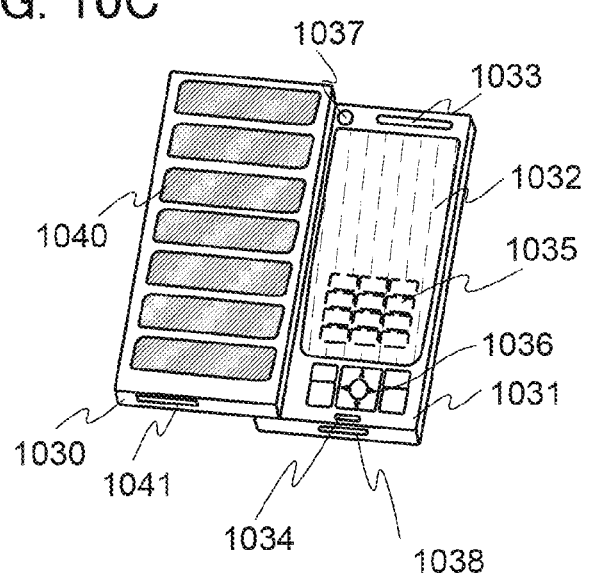

FIG. 10C illustrates a mobile phone that includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. The transistor described in Embodiment 2 is applied to the display panel 1032, whereby a highly reliable mobile phone can be provided.

Further, the display panel 1032 includes a touch panel. A plurality of operation keys 1035 that are displayed as images are indicated by dotted lines in FIG. 10C. Note that a boosting circuit by which a voltage output from the solar cell 1040 is increased so as to be sufficiently high for each circuit is also included.

For example, a power transistor used for a power supply circuit such as a boosting circuit can also be formed when the semiconductor layer of the transistor described in the Embodiment 2 has a thickness greater than or equal to 2 μm and less than or equal to 50 μm.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, and the like as well as voice calls. Moreover, the housings 1030 and 1031 in a state where they are developed as illustrated in FIG. 10C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 10D:
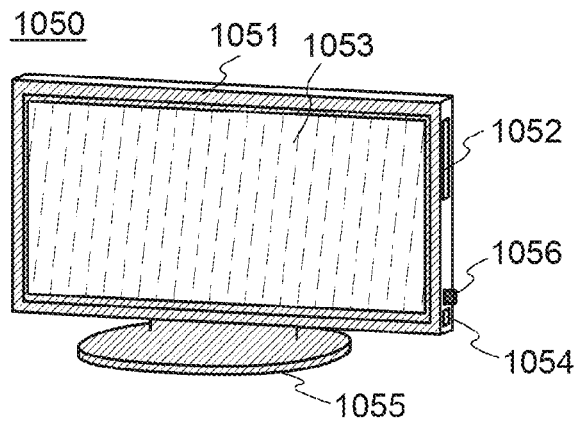

FIG. 10D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. The transistor described in Embodiment 2 is applied to the display portion 1053 and the CPU, whereby the television set 1050 can be highly reliable.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, the television set 1050 can receive general TV broadcasts. Moreover, when the television set 1050 is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, whereby data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in Embodiment 2 is extremely small, when the transistor is applied to the external memory 1056 or the CPU, the television set 1050 can have high reliability and sufficiently reduced power consumption.

Note that this embodiment can be combined with any of the other embodiments and examples described in this specification as appropriate.

Example 1

This example describes results of processing a conductive film by a method for processing a thin film of one embodiment of the present invention.

[Fabrication of Sample]

A silicon wafer was used as a substrate of the fabricated sample. The substrate was subjected to thermal oxidation, so that a thermal oxidation film was formed over the substrate surface. Next, an approximately 300-nm-thick oxynitride silicon film was formed over thermal oxidation film by a plasma CVD method, and then a surface of the oxynitride silicon film was planarized by chemical mechanical polishing (CMP).

Next, an approximately 35-nm-thick oxide semiconductor film was formed by a sputtering method. After that, an approximately 20-nm-thick organic coating film and an approximately 100-nm-thick resist film were formed over the oxide semiconductor film. Then, the resist film was exposed to an electron beam by an electron beam scanning and then was developed, so that the resist film was patterned. Subsequently, the organic coating film and the oxide semiconductor film were etched using the resist film as a mask, and the organic coating film and the resist film were removed by plasma treatment in an atmosphere containing oxygen, so that an island-shaped semiconductor layer was obtained.

Next, as a conductive film, an approximately 10-nm-thick tungsten film was deposited by a sputtering method. Then, an approximately 20-nm-thick organic coating film and an approximately 100-nm-thick resist film were formed.

Then, the resist film was exposed to an electron beam by an electron beam scanning and then was developed, so that the resist film was patterned.

Subsequently, plasma treatment was performed, so that an organic material layer was formed on the surface of the resist film. After that, the organic coating film and the conductive film were etched using the resist film and the organic material layer as masks.

Here, two kinds of samples fabricated under different conditions of the plasma treatment and the etching of the organic coating film and the conductive film were prepared. Further, as Comparative example, another sample that was not subjected to the plasma treatment was prepared.

<Sample 1>

The plasma treatment for Sample 1 was performed under the following conditions: the flow rates of $CHF_3$ and He were 30 sccm and 120 sccm, respectively; the ICP power was 475 W; the bias power was 300 W; the pressure was 5.5 Pa; the substrate temperature was 70° C., and the treatment time was 10 seconds. As the etching of the organic coating film and the conductive film for Sample 1, first etching and second etching were sequentially performed. The first etching was performed under the following conditions: the flow rate of $CF_4$ was 100 sccm; the ICP power was 2000 W; the bias power was 50 W; the pressure was 0.67 Pa; the substrate temperature was −10° C.; and the treatment time was approximately 12 seconds. The second etching was performed under the following conditions: the flow rates of $CF_4$ and oxygen were 60 sccm and 40 sccm, respectively; the ICP power was 1000 W; the bias power was 250 W; the pressure was 2.0 Pa; the substrate temperature was −10° C.; and the treatment time was approximately 14 seconds.

<Sample 2>

The plasma treatment for Sample 2 was performed under the following conditions: the flow rates of $CHF_3$ and He were 7.5 sccm and 142.5 sccm, respectively; the ICP power was 475 W; the bias power was 300 W; the pressure was 5.5 Pa; the substrate temperature was 70° C., and the treatment time was 20 seconds. The etching of the organic coating film and the conductive film for Sample 2 was performed under the following conditions: the flow rates of $CF_4$ and oxygen were 60 sccm and 40 sccm, respectively; the ICP power was 1000 W; the bias power was 250 W; the pressure was 2.0 Pa; the substrate temperature was −10° C.; and the treatment time was approximately 13 seconds.

Comparative Example

On Comparative example, the plasma treatment was not performed and only the etching treatment on the organic coating film and the conductive film was performed. The etching of the organic coating film and the conductive film was performed under conditions similar to those for Sample 1.

After that, plasma treatment was performed on each sample in an oxygen atmosphere to remove the resist film, the organic material layer, and the organic coating film, so that samples in each of which a conductive film was patterned into two separate parts were obtained.

[Results of Length Measurement of Pattern]

For each sample, scanning electron microscope (SEM) images of the top surface were obtained, and the space width of the pattern was measured using each image. The SEM images were observed three times at the following timings: right after the patterning of the resist film, right after the plasma treatment, and right after the etching of the conductive film (note that for Comparative example, the SEM images were observed twice because Comparative example was not subjected to the plasma treatment).

Figure 11A:
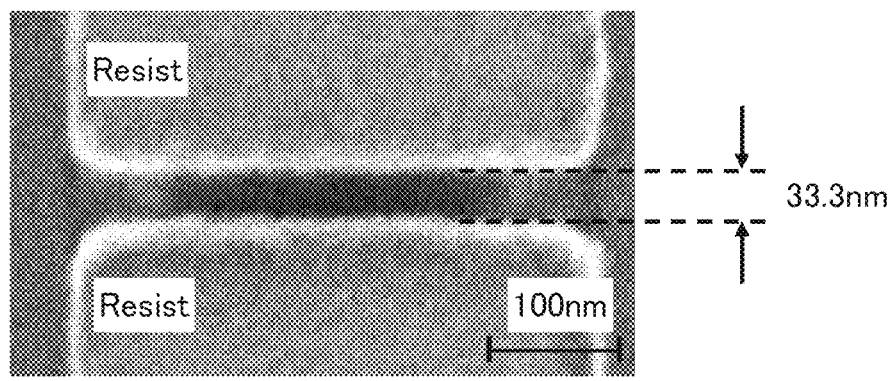
FIGS. 11A to 11C are SEM images of an example.
Figure 11B:
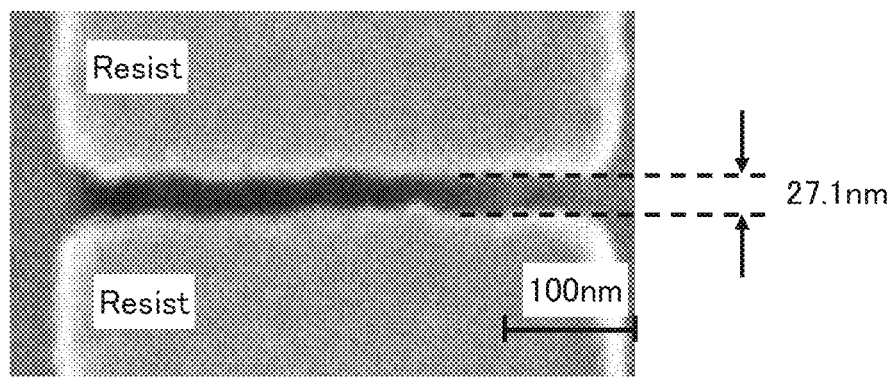
Figure 11C:
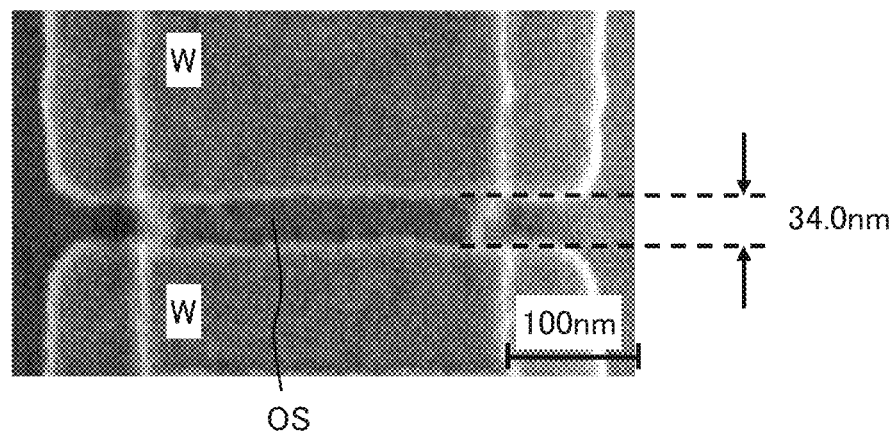

FIG. 11A is a SEM image of Sample 1 obtained right after the patterning of the resist film. FIG. 11B is a SEM image of the top surface of Sample 1 obtained right after the plasma treatment. FIG. 11C is a SEM image of the top surface of Sample 1 obtained right after the etching of the conductive film.

FIGS. 11A to 11C show that the space width of the pattern of the resist film right after the plasma treatment is narrower than that right after the patterning of the resist film. It is also found that the space width of the pattern of the conductive film right after the etching of the conductive film is wider than the space width of the pattern of the resist film right after the plasma treatment, and is substantially the same as the space width of the pattern of the resist film right after the patterning of the resist film.

Figure 12A:
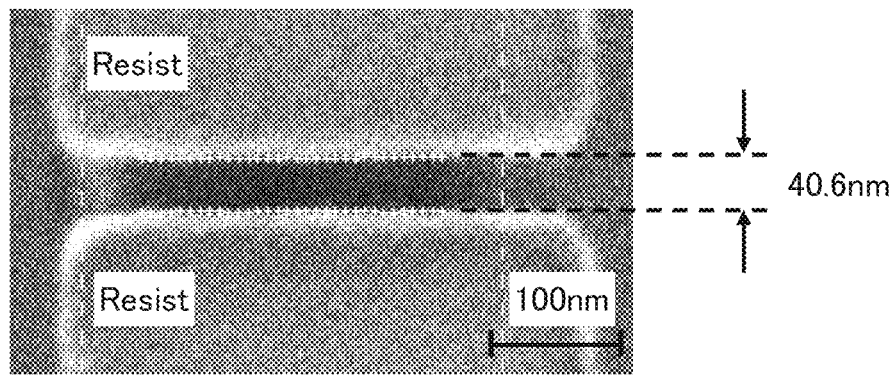
FIGS. 12A to 12C are SEM images of an example.
Figure 12B:
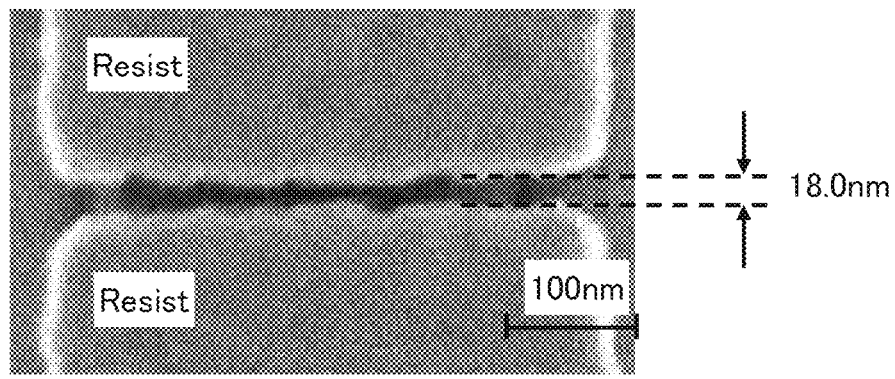
Figure 12C:
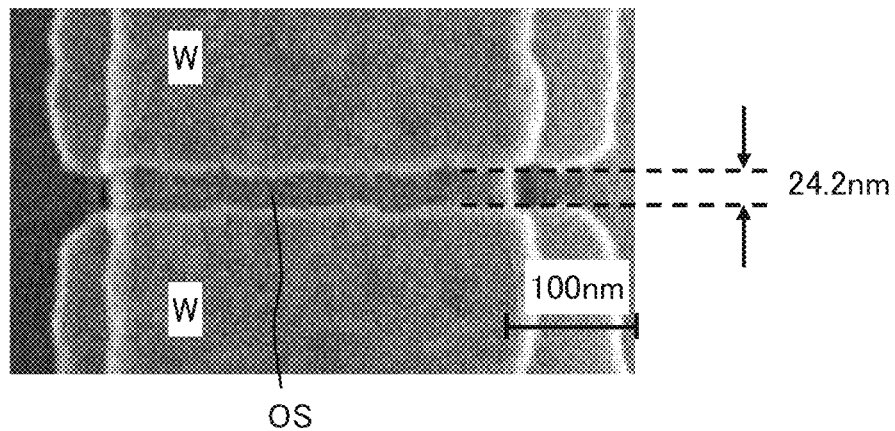

FIG. 12A is a SEM image of Sample 2 obtained right after the patterning of the resist film. FIG. 12B is a SEM image of the top surface of Sample 2 obtained right after the plasma treatment. FIG. 12C is a SEM image of the top surface of Sample 2 obtained right after the etching of the conductive film.

As illustrated in FIGS. 12A to 12C, Sample 2 shows a tendency similar to that of Sample 1, and the space width of the pattern of the resist film right after the plasma treatment is even narrower. Further, the space width of the pattern of the conductive film right after the etching of the conductive film is narrower than the space width of the pattern of the resist film right after the patterning of the resist film. As described above, the conditions of the plasma treatment and the etching treatment are changed, so that the space width of the pattern of the conductive film that is a processed film can be narrower than the designed size (here, the space width of the pattern of the resist film) and minuter processing can be performed.

Figure 13A:
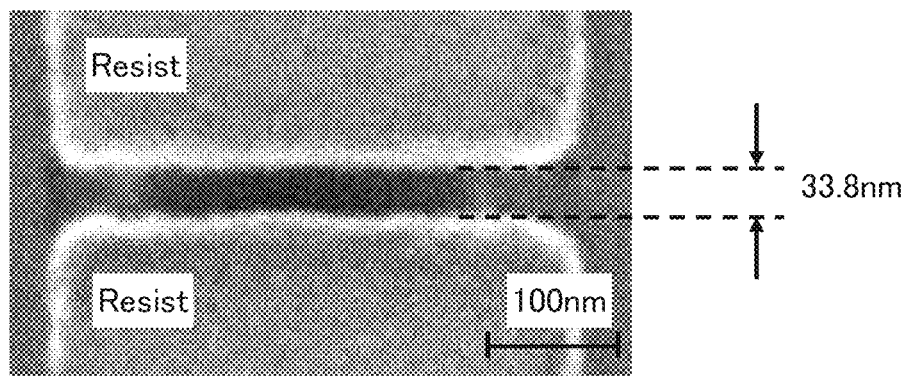
FIGS. 13A and 13B are SEM images of an example.
Figure 13B:
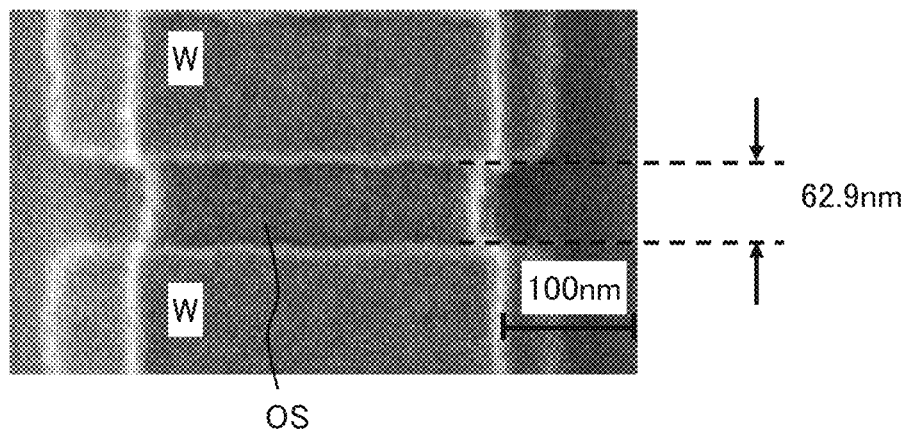

FIG. 13A is a SEM image of Comparative example obtained right after the patterning of the resist film. FIG. 13B is a SEM image of the top surface of Comparative example obtained right after the etching of the conductive film.

As illustrated in FIGS. 13A and 13B, in the case where plasma treatment was not performed, CD loss occurred and the space width of the pattern of the conductive film right after the etching of the conductive film is wider than the space width of the pattern of the resist film.

Figure 14:
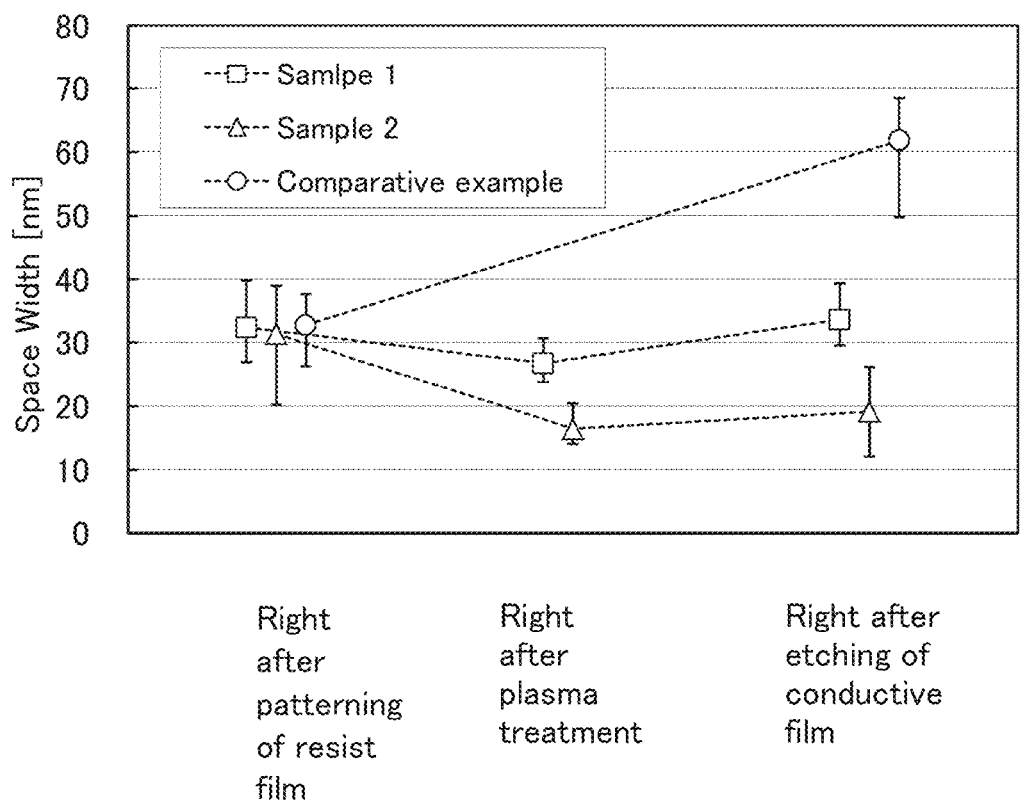
FIG. 14 shows results of length measurement of an example.

FIG. 14 shows the results of measuring the space width of the pattern of the resist film using the obtained SEM images. Observation of the SEM images was performed at 25 points in a substrate with a size of 12.6 mm×12.6 mm. In FIG. 14, average values of the 25 points are plotted and the ranges between the maximum values and the minimum values are shown as margins of error.

FIG. 14 shows that in Comparative example, the space width of the pattern of the conductive film right after the etching of the conductive film is approximately twice as great as the space width of the pattern of the resist film right after the patterning of the resist film, and in contrast, in Sample 1, the space width of the pattern of the conductive film right after the etching of the conductive film is substantially the same as the space width of the pattern of the resist film right after the patterning of the resist film. Accordingly, CD loss was able to be substantially eliminated in Sample 1. In Sample 2, the space width of the pattern of the resist film right after the patterning of the resist film is around 30 nm, whereas the space width of the pattern of the conductive film right after the etching of the conductive film is as small as around 20 nm, and variation is also reduced.

Example 2

In this example, results of an investigation on gases contained in a deposition apparatus during plasma treatment and composition analysis of an organic material layer deposited on a surface of a resist film are described.

[Analysis of Gas in Plasma Treatment]

First, a sample in which an approximately 100-nm-thick resist film was formed over a silicon wafer was prepared.

Then, at the time of performing plasma treatment on the sample, gas components in a treatment chamber were measured by a quadrupole mass analyzer (Q-mass: quadrupole mass spectrometer).

Plasma treatment was performed under the following conditions: the ICP power was 475 W; the bias power was 300 W; the pressure was 5.5 Pa; and the reaction gas was a mixed gas of $CHF_3$ and He. For the flow ratio of $CHF_3$, three kinds of conditions were prepared: 6.7%, 20.0%, and 33.0% of the reaction gas.

Figure 15:
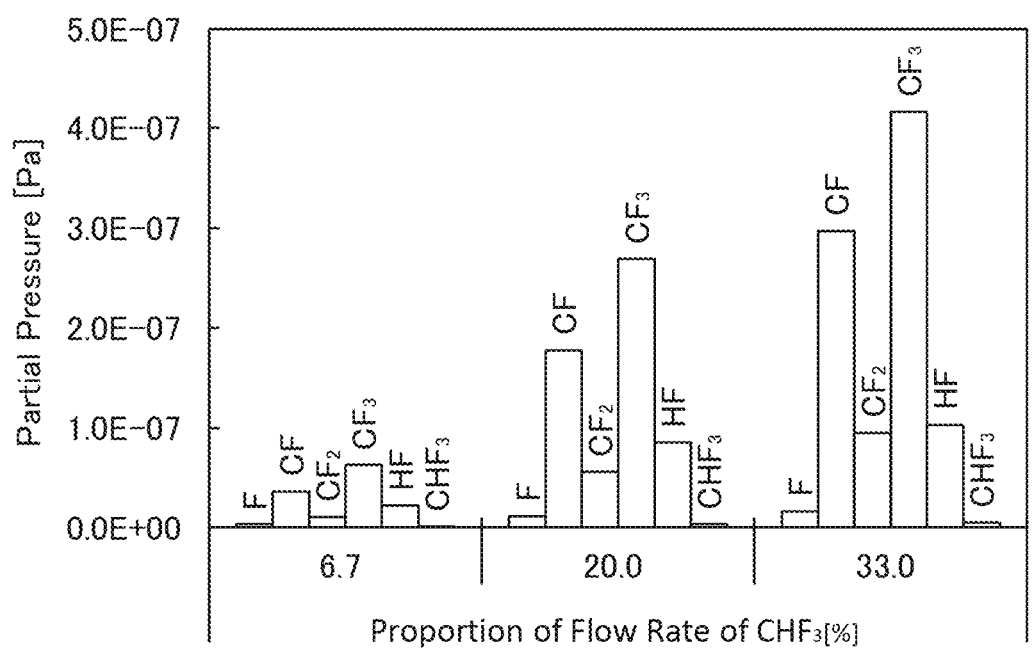
FIG. 15 shows measurement results by a quadrupole mass analyzer of an example.

FIG. 15 shows the partial pressure of major detected gases with respect to the proportion of the flow rate of $CHF_3$. It is found from FIG. 15 that compounds containing fluorine and carbon such as CF, $CF_2$, and $CF_3$ were generated during the plasma treatment. This indicates that the surface of the resist film is processed by such CF-based active species during the plasma treatment, so that fluorocarbon polymer including, as a main component, the above-described compound containing fluorine and carbon is deposited as an organic material layer on the surface of the resist film.

[Composition Analysis of Organic Material Layer]

Next, composition analysis was performed on the surface of the resist film before plasma treatment and that after the plasma treatment by X-ray photoelectron spectroscopy (XPS).

A sample in which an approximately 100-nm-thick resist film was formed over a silicon wafer was prepared. Plasma treatment was performed under the following conditions: the ICP power was 475 W; the bias power was 300 W; the pressure was 5.5 Pa; the flow rates of $CHF_3$ and He were 7.5 sccm and 142.5 sccm, respectively; and the treatment time was 20 seconds.

Figure 16A:
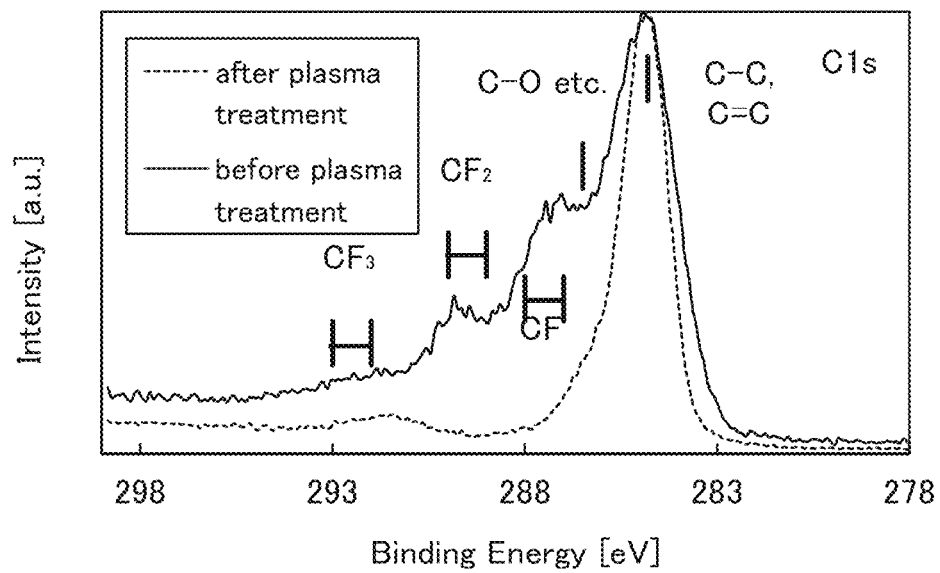
FIGS. 16A and 16B show XPS spectra of an example.
Figure 16B:
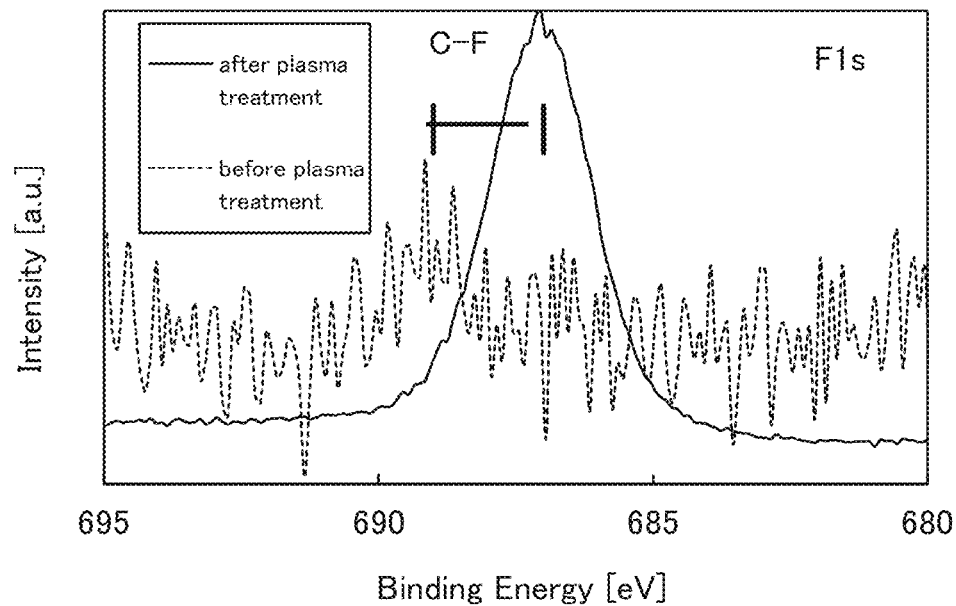

FIGS. 16A and 16B show XPS spectra measured as an example. FIG. 16A shows enlarged spectra in the vicinity of 280 eV that correspond to C1s. FIG. 16B shows enlarged spectra in the vicinity of 690 eV that correspond to F1s. In each of FIGS. 16A and 16B, the spectrum before the plasma treatment is indicated by a dashed line and the spectrum after the plasma treatment is indicated by a solid line.

From FIGS. 16A and 16B, it is found that a plurality of peaks showing bonding including fluorine are observed on the spectra of the surface of the resist film after the plasma treatment.

Table 1 shows the compositions of the surface of the resist film estimated from the XPS spectra.

TABLE 1

|  | C | F | O | [atomic %] N |
|---|---|---|---|---|
| before plasma treatment | 88.7 | 0.2 | 10.3 | 0.8 |
| after plasma treatment | 62.7 | 30.4 | 6.5 | 0.5 |

From Table 1, it can be confirmed that a large amount of fluorine is contained in the surface of the resist film after the plasma treatment.

Thus, it can be confirmed that the organic material layer formed by plasma treatment right after the patterning of the resist film is fluorocarbon polymer including a compound containing fluorine and carbon such as CF, $CF_2$, and $CF_3$.

This application is based on Japanese Patent Application serial no. 2013-059315 filed with Japan Patent Office on Mar. 22, 2013, the entire contents of which are hereby incorporated by reference.

What is claimed is:

1. A method for manufacturing a semiconductor device, comprising the steps of:
    forming a semiconductor layer;
    forming a conductive film over the semiconductor layer;
    forming a resist film over the conductive film;
    exposing the resist film to light or an electron beam;
    removing part of the resist film, which is exposed to the light or the electron beam;
    depositing an organic material layer on a side surface of the resist film;
    etching part of the conductive film using the resist film and the organic material layer as masks to form a first electrode and a second electrode;
    forming an insulating layer over the semiconductor layer, the first electrode, and the second electrode; and
    forming an electrode over the insulating layer so as to overlap with the semiconductor layer.

2. The method for manufacturing the semiconductor device according to claim 1, further comprising:
    forming an organic film on the conductive film after forming the conductive film and before forming the resist film; and
    etching part of the organic film using the resist film and the organic material layer as masks to expose part of the conductive film.

3. The method for manufacturing the semiconductor device according to claim 2,
    wherein the organic material layer is deposited by plasma treatment,
    wherein the plasma treatment is performed using a gas including fluorine and carbon, and
    wherein the etching of the organic film is performed by dry etching using a gas including fluorine and carbon and a gas containing oxygen.

4. The method for manufacturing the semiconductor device according to claim 3,
    wherein the plasma treatment and the etching of the organic film are performed using a gas that does not contain chlorine.

5. The method for manufacturing the semiconductor device according to claim 1, wherein the step of exposing the resist film to light is performed using extreme ultraviolet light or X-rays.

6. The method for manufacturing the semiconductor device according to claim 1,
    wherein the organic material layer is further deposited on a top surface of the resist film.

7. The method for manufacturing the semiconductor device according to claim 1,
    wherein the semiconductor layer is formed over a substrate.

8. A method for manufacturing a semiconductor device, comprising the steps of:
    forming a semiconductor layer;
    forming a conductive film over the semiconductor layer;
    forming a resist film over the conductive film;
    exposing the resist film to light or an electron beam;
    removing part of the resist film, which is exposed to the light or the electron beam;
    depositing an organic material layer on a side surface of the resist film;
    etching part of the conductive film using the resist film and the organic material layer as masks to form a first electrode and a second electrode;
    forming an insulating layer over the semiconductor layer, the first electrode, and the second electrode; and forming an electrode over the insulating layer so as to overlap with the semiconductor layer, wherein the semiconductor layer comprises an oxide semiconductor.

9. The method for manufacturing the semiconductor device according to claim 8, further comprising:

forming an organic film on the conductive film after forming the conductive film and before forming the resist film; and etching part of the organic film using the resist film and the organic material layer as masks to expose part of the conductive film.

10. The method for manufacturing the semiconductor device according to claim 9, wherein the organic material layer is deposited by plasma treatment, wherein the plasma treatment is performed using a gas including fluorine and carbon, and wherein the etching of the organic film is performed by dry etching using a gas including fluorine and carbon and a gas containing oxygen.

11. The method for manufacturing the semiconductor device according to claim 10, wherein the plasma treatment and the etching of the organic film are performed using a gas that does not contain chlorine.

12. The method for manufacturing the semiconductor device according to claim 8, wherein the step of exposing the resist film to light is performed using extreme ultraviolet light or X-rays.

13. The method for manufacturing the semiconductor device according to claim 8, wherein the organic material layer is further deposited on a top surface of the resist film.

14. The method for manufacturing the semiconductor device according to claim 8, wherein the semiconductor layer is formed over a substrate.

15. The method for manufacturing the semiconductor device according to claim 8, wherein the semiconductor layer comprises at least one of In and Zn.

16. A method for manufacturing a semiconductor device, comprising the steps of:

forming a semiconductor layer over a substrate;

forming a conductive film over the substrate;

forming a resist film over the conductive film;

exposing the resist film to light or an electron beam;

removing part of the resist film, which is exposed to the light or the electron beam;

depositing an organic material layer on a side surface of the resist film; and etching part of the conductive film using the resist film and the organic material layer as masks to form a first electrode and a second electrode.

17. The method for manufacturing the semiconductor device according to claim 16, wherein the step of exposing the resist film to light is performed using extreme ultraviolet light or X-rays.

18. The method for manufacturing the semiconductor device according to claim 16, wherein the organic material layer is deposited by plasma treatment.

19. The method for manufacturing the semiconductor device according to claim 16, wherein the organic material layer is further deposited on a top surface of the resist film.

* * * * *